(12) United States Patent
Mei et al.

(10) Patent No.: US 11,637,262 B2
(45) Date of Patent: Apr. 25, 2023

(54) ARRAY SUBSTRATE AND MANUFACTURING METHOD THEREFOR, AND DISPLAY PANEL

(71) Applicant: BOE TECHNOLOGY GROUP CO., LTD., Beijing (CN)

(72) Inventors: Wenhai Mei, Beijing (CN); Tuo Sun, Beijing (CN); Yanzhao Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 201 days.

(21) Appl. No.: 17/264,897

(22) PCT Filed: May 29, 2020

(86) PCT No.: PCT/CN2020/093156
§ 371 (c)(1),
(2) Date: Feb. 1, 2021

(87) PCT Pub. No.: WO2020/248833
PCT Pub. Date: Dec. 17, 2020

(65) Prior Publication Data
US 2021/0305526 A1    Sep. 30, 2021

(30) Foreign Application Priority Data
Jun. 12, 2019 (CN) .......................... 201910506753.2

(51) Int. Cl.
*H01L 51/50* (2006.01)
*H01L 27/32* (2006.01)
*H01L 51/56* (2006.01)

(52) U.S. Cl.
CPC ........ *H01L 51/502* (2013.01); *H01L 27/3246* (2013.01); *H01L 51/56* (2013.01); *H01L 2227/323* (2013.01)

(58) Field of Classification Search
None
See application file for complete search history.

(56) References Cited

U.S. PATENT DOCUMENTS 10,998,389 B2    5/2021 Dai
2015/0331278 A1   11/2015 Araki et al.
(Continued)

FOREIGN PATENT DOCUMENTS

CN    105206641 A    12/2015
CN    108539031 A     9/2018
(Continued)

*Primary Examiner* — Michelle Mandala
(74) *Attorney, Agent, or Firm* — Chiwin Law LLC

(57) ABSTRACT

Embodiments of the present disclosure provide an array substrate and a manufacturing method therefor, and a display panel. The array substrate includes: a substrate and a pixel defining layer provided on the substrate, the pixel defining layer including a plurality of opening areas, and the plurality of opening areas being provided with a plurality of quantum dot light-emitting devices in a one-to-one correspondence manner; each of the quantum dot light-emitting devices includes a quantum dot light-emitting layer, and the quantum dot light-emitting layer is made of a quantum dot material. At least one of the pixel defining layer and the quantum dot material is magnetic.

16 Claims, 16 Drawing Sheets

(56) References Cited

U.S. PATENT DOCUMENTS

| | | | |
|---|---|---|---|
| 2020/0052154 A1* | 2/2020 | Zhang | H01L 51/5012 |
| 2020/0073169 A1* | 3/2020 | Jung | G02F 1/134309 |
| 2020/0343467 A1 | 10/2020 | Li | |
| 2021/0036253 A1* | 2/2021 | Asaoka | H01L 27/32 |
| 2021/0083144 A1* | 3/2021 | Xiang | H01L 33/06 |
| 2022/0199716 A1* | 6/2022 | Nakanishi | H01L 51/56 |

FOREIGN PATENT DOCUMENTS

| | | |
|---|---|---|
| CN | 108922915 A | 11/2018 |
| CN | 109037464 A | 12/2018 |
| CN | 109346506 A | 2/2019 |
| CN | 110164947 A | 8/2019 |

\* cited by examiner

S501: Coating a solution including a quantum dot material emitting light of the first color on the substrate 10 to form a first color quantum dot light emitting film 1211; applying the second magnetic field to the substrate 10 so that the second magnetic field acts on an area where the first color quantum dot light emitting layer 1211 is to be formed; removing the first color quantum dot light emitting film 1211 in an area, where no magnetic field acts on, of the first color quantum dot light emitting film 1211, and curing and cross-linking the quantum dot material in the first color quantum dot light emitting film 1211 that is remained by heating or irradiating to form the first color quantum dot light emitting layer 121

S502: Coating a solution including a quantum dot material emitting light of the second color on the substrate 10, on which the first color quantum dot light emitting layer 121 is formed, to form a second color quantum dot light emitting film 1221; making the second magnetic field act on an area where the second color quantum dot light emitting layer 122 is to be formed; removing the second color quantum dot light emitting film 1221 in an area, where no magnetic field acts on, of the second color quantum dot light emitting film 1221, and curing and cross-linking the quantum dot material in the second color quantum dot light emitting film 1221 that is remained by heating or irradiating to form the second color quantum dot light emitting layer 122

S503: Coating a solution including a quantum dot material emitting light of the third color on the substrate 10, on which the first color quantum dot light emitting layer 121 and the second color quantum dot light emitting layer 122 are formed, to form a third color quantum dot light emitting film 1231; making the second magnetic field act on an area where the third color quantum dot light emitting layer 123 is to be formed; removing the third color quantum dot light emitting film 1231 in an area, where no magnetic field acts on, of the third color quantum dot light emitting film 1231, and curing and cross-linking the quantum dot material in the third color quantum dot light emitting film 1231 that is remained by heating or irradiating to form the third color quantum dot light emitting layer 123

FIG. 15

ARRAY SUBSTRATE AND MANUFACTURING METHOD THEREFOR, AND DISPLAY PANEL

This application is a U.S. National Phase Entry of International Application No. PCT/CN2020/093156 filed on May 29, 2020, designating the United States of America and claiming priority to Chinese Patent Application No. 201910506753.2, filed on Jun. 12, 2019. The present application claims priority to and the benefit of the above-identified applications and the above-identified applications are incorporated by reference herein in their entirety.

TECHNICAL FIELD

The embodiments of the present disclosure relate to an array substrate and a manufacturing method thereof, and a display panel.

BACKGROUND

As a new type of luminescent material, quantum dots have the advantages of high light color purity, high luminous quantum efficiency, adjustable luminous color, and long service life, and currently, have become a research hotspot of the new type of luminescent material. At present, a light emitting device using the quantum dot material as a light emitting layer has become a main research direction of new type display devices.

SUMMARY

An embodiment of the present disclosure discloses an array substrate and a manufacturing method thereof, and a display panel.

An embodiment provides an array substrate, including a substrate and a pixel defining layer disposed on the substrate, the pixel defining layer including a plurality of opening areas, and a plurality of quantum dot light emitting devices being arranged in one-to-one correspondence with the plurality of opening areas; each of the plurality of quantum dot light emitting devices including a quantum dot light emitting layer, and a material of the quantum dot light emitting layer being a quantum dot material. At least one selected from the group consisting of a material of the pixel defining layer and the quantum dot material is magnetic.

For example, in an example of the present disclosure, a thickness of the pixel defining layer ranges from 20 nm to 50 nm.

For example, in an example of the present disclosure, the pixel defining layer includes a magnetic particle, and the magnetic particle includes a first magnetic nanoparticle and an insulating layer that wraps the first magnetic nanoparticle.

For example, in an example of the present disclosure, the magnetic particle includes a ferromagnetic particle.

For example, in an example of the present disclosure, a surface of the insulating layer has a first cross-linking group.

For example, in an example of the present disclosure, a quantum dot in the quantum dot material includes a quantum dot core, a quantum dot shell that wraps the quantum dot core, a magnetic nano layer, and a ligand, the quantum dot shell is wrapped by the magnetic nano layer, the ligand is located on an outer surface of the magnetic nano layer, and the ligand includes a second cross-linking group.

For example, in an example of the present disclosure, the magnetic nano layer includes a second magnetic nanoparticle, and a thickness of the magnetic nano layer is 1 to 3 times of a particle diameter of the second magnetic nanoparticle.

For example, in an example of the present disclosure, the second magnetic nanoparticle includes a ferromagnetic nanoparticle.

For example, in an example of the present disclosure, the first cross-linking group and the second cross-linking group include at least one selected from the group consisting of an allyl group, a sulfhydryl group, an olefin, a diene, and an epoxy.

An embodiment of the present disclosure provides a display panel, including the array substrate as mentioned above, the display panel further includes an encapsulation layer disposed on a side of the plurality of quantum dot light emitting devices away from the substrate.

An embodiment of the present disclosure provides a manufacturing method of an array substrate, including: forming a pixel defining layer including a plurality of opening areas on a substrate; and forming a plurality of quantum dot light emitting devices in the plurality of opening areas of the pixel defining layer, the quantum dot light-emitting device including a quantum dot light emitting layer, a material of the quantum dot light emitting layer being a quantum dot material. Forming the pixel defining layer on the substrate includes: coating a solution including magnetic particles on the substrate to form a pixel defining film; applying a first magnetic field to the substrate so that the first magnetic field acts on an area where the pixel defining layer is to be formed; and removing the pixel defining film in an area, where no magnetic field acts on, of the pixel defining film, and curing and cross-linking the magnetic particles in the pixel defining film that is remained by heating or irradiating to form the pixel defining layer including the plurality of opening areas.

For example, in an example of the present disclosure, removing the pixel defining film in the area, where no magnetic field acts on, of the pixel defining film, includes: coating a first solution on the pixel defining film; washing the magnetic particles in the pixel defining film in the area, where no magnetic field acts on, of the pixel defining film; and removing the pixel defining film in the area, where no magnetic field acts on, of the pixel defining film, a thickness of the pixel defining film ranging from 20 nm to 50 nm.

For example, in an example of the present disclosure, applying the first magnetic field to the substrate includes: placing a first magnetic plate that is patterned on a side of the substrate along a thickness direction of the substrate, wherein an orthographic projection of a magnetic area of the first magnetic plate that is patterned on the substrate completely overlaps with an orthographic projection of an area where the pixel defining layer is to be formed on the substrate; and paramagnetizing the first magnetic plate so that a magnetic field direction of the first magnetic field applied to the substrate by the first magnetic plate is parallel to the thickness direction of the substrate.

An embodiment of the present disclosure provides a manufacturing method of an array substrate, including: forming a plurality of quantum dot light emitting devices on a substrate, wherein each of the plurality of quantum dot light emitting devices includes a quantum dot light emitting layer, a material of the quantum dot light emitting layer is a quantum dot material, and the quantum dot material is magnetic, and forming the quantum dot light emitting layer includes: coating a solution including the quantum dot material on the substrate to form a quantum dot light emitting film; applying a second magnetic field to the substrate so that the second magnetic field acts on an area where the quantum dot light emitting layer is to be formed; removing the quantum dot light emitting film in an area, where no magnetic field acts on, of the quantum dot light emitting film, and curing and cross-linking the quantum dot material in the quantum dot light emitting film that is remained by heating or irradiating to form the quantum dot light emitting layer; after forming the plurality of quantum dot light emitting devices, the method further includes: forming a pixel defining layer including a plurality of opening areas on the substrate, wherein the plurality of quantum dot light emitting devices are in one-to-one correspondence with the plurality of opening areas and are located in the plurality of opening areas.

For example, in an example of the present disclosure, removing the quantum dot light emitting film in the area, where no magnetic field acts on, of the quantum dot light emitting film includes: coating a second solution on the quantum dot light emitting film; washing the quantum dot material in the quantum dot light emitting film in the area, where no magnetic field acts on, of the quantum dot light emitting film; and removing the quantum dot light emitting film in the area, where no magnetic field acts on, of the quantum dot light emitting film.

For example, in an example of the present disclosure, the plurality of quantum dot light emitting devices include a quantum dot light emitting device that emits light of a first color, a quantum dot light emitting device that emits light of a second color, and a quantum dot light emitting device that emits light of a third color; the quantum dot light emitting device that emits light of the first color includes a first color quantum dot light emitting layer; the quantum dot light emitting device that emits light of the second color includes a second color quantum dot light emitting layer; and the quantum dot light emitting device that emits light of the third color includes a third color quantum dot light emitting layer. Forming quantum dot light emitting layers in the plurality of quantum dot light emitting devices includes: coating a solution including a quantum dot material emitting light of the first color on the substrate to form a first color quantum dot light emitting film; applying the second magnetic field to the substrate so that the second magnetic field acts on an area where the first color quantum dot light emitting layer is to be formed; removing the first color quantum dot light emitting film in an area, where no magnetic field acts on, of the first color quantum dot light emitting film, and curing and cross-linking the quantum dot material in the first color quantum dot light emitting film that is remained by heating or irradiating to form the first color quantum dot light emitting layer; coating a solution including a quantum dot material emitting light of the second color on the substrate, on which the first color quantum dot light emitting layer is formed, to form a second color quantum dot light emitting film; making the second magnetic field act on an area where the second color quantum dot light emitting layer is to be formed; removing the second color quantum dot light emitting film in an area, where no magnetic field acts on, of the second color quantum dot light emitting film, and curing and cross-linking the quantum dot material in the second color quantum dot light emitting film that is remained by heating or irradiating to form the second color quantum dot light emitting layer; and coating a solution including a quantum dot material emitting light of the third color on the substrate, on which the first color quantum dot light emitting layer and the second color quantum dot light emitting layer are formed, to form a third color quantum dot light emitting film; making the second magnetic field act on an area where the third color quantum dot light emitting layer is to be formed; removing the third color quantum dot light emitting film in an area, where no magnetic field acts on, of the third color quantum dot light emitting film, and curing and cross-linking the quantum dot material in the third color quantum dot light emitting film that is remained by heating or irradiating to form the third color quantum dot light emitting layer.

For example, in an example of the present disclosure, applying the second magnetic field to the substrate includes: placing a second magnetic plate that is patterned on a side of the substrate along a thickness direction of the substrate, wherein an orthographic projection of a magnetic area of the second magnetic plate that is patterned on the substrate completely overlaps with an orthographic projection of an area where the quantum dot light emitting layer is to be formed on the substrate; and paramagnetizing the second magnetic plate so that a magnetic field direction of the second magnetic field applied to the substrate by the second magnetic plate is parallel to the thickness direction of the substrate.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

FIG. 15 is a flowchart of a manufacturing method of yet another array substrate provided by an embodiment of the present disclosure;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

Figure 1A:
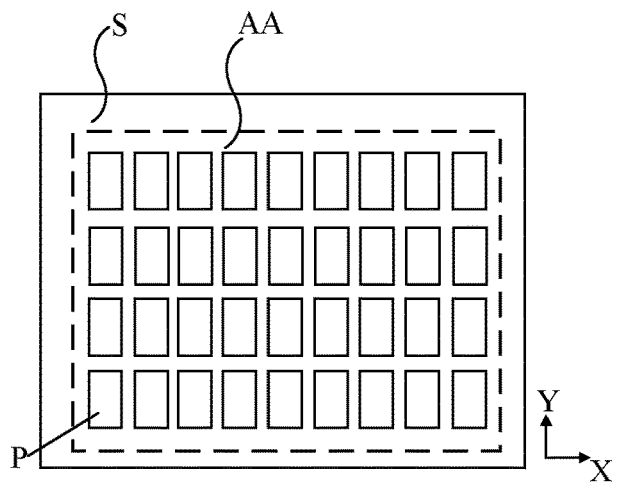
FIG. 1A is a schematic top view of a display panel provided by an embodiment of the present disclosure.
Figure 1B:
FIG. 1B is a schematic partial cross-sectional structure diagram of the display panel shown in FIG. 1A.

FIG. 1A is a schematic top view of a display panel provided by an embodiment of the present disclosure, and FIG. 1B is a schematic cross-sectional structure diagram of the display panel shown in FIG. 1A. As shown in FIG. 1A and FIG. 1B, an embodiment of the present disclosure provides a display panel including: an array substrate 1 and an encapsulation layer 2.

As shown in FIG. 1A, the display panel can be divided into an active area (AA area for short) and a peripheral area S, for example, the peripheral area S is arranged in a circle around the AA area. The above-mentioned active area is an area used for display, and the peripheral area is an area not used for display. The above-mentioned active area includes sub-pixels P of a plurality of colors, and the sub-pixels of the plurality of colors at least include a first color sub-pixel, a second color sub-pixel, and a third color sub-pixel, the first color, the second color, and the third color are three primary colors (for example, red, green, and blue). An area of any sub-pixel P can be defined by a pixel defining layer. The above-mentioned peripheral area may include structures such as a driving circuit and connecting wires.

In the embodiments of the present disclosure, a case that the plurality of sub-pixels P as mentioned above are arranged in a matrix form is taken as an example for illustration, but the present disclosure is not limited to this, the plurality of sub-pixels as mentioned above may also be arranged in a diamond pixel arrangement structure and the like. For example, the sub-pixels P arranged in a row along a horizontal direction X are called sub-pixels in the same row, and the sub-pixels P arranged in a row along a vertical direction Y are called sub-pixels in the same column. The sub-pixels in the same row can be connected to one gate line extending in the row direction, and the sub-pixels in the same column can be connected to one data line extending in the column direction.

Figure 2:
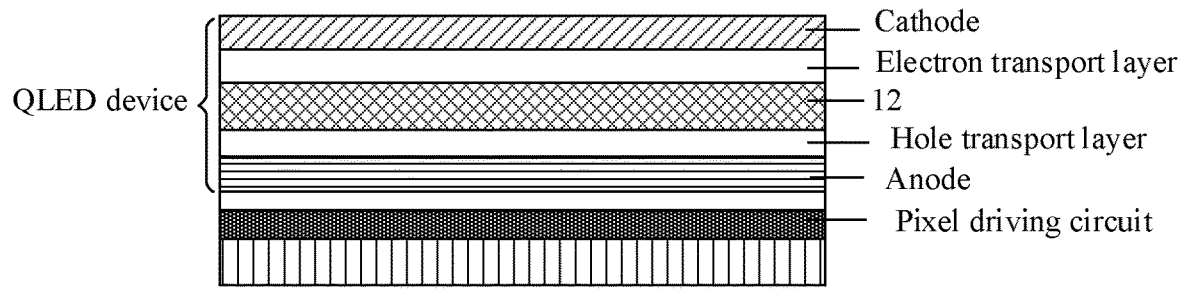
FIG. 2 is a schematic diagram of a structure of a sub-pixel in a display panel provided by an embodiment of the present disclosure.

FIG. 2 is a schematic diagram of a structure of a sub-pixel in a display panel provided by an embodiment of the present disclosure. As shown in FIG. 2, a quantum dot light emitting device is provided in each sub-pixel P.

For example, a pixel driving circuit that controls the quantum dot light emitting device to emit light is also provided in each sub-pixel P. The pixel driving circuit may be composed of electronic devices such as a thin film transistor (TFT for short) and a capacitor (C for short). For example, the pixel driving circuit may be a pixel driving circuit having a structure of 2T1C including two thin film transistors (a switching TFT and a driving TFT) and a capacitor. Of course, the pixel driving circuit can also be a pixel driving circuit including more than two thin film transistors (a plurality of switching TFTs and one driving TFT) and at least one capacitor. For example, the pixel driving circuit may include a 7T1C (that is, seven transistors and one capacitor) structure, a 7T2C structure, a 6T1C structure, a 6T2C structure, or a 9T2C structure, which is not limited in the embodiment of the present disclosure. Regardless of the structure of the pixel driving circuit, the pixel driving circuit must include a driving transistor.

For example, the encapsulation layer is used to encapsulate the quantum dot light emitting device and is arranged on a side of the quantum dot light emitting device away from the substrate. The encapsulation layer may be a thin film encapsulation layer or an encapsulation substrate.

Figure 4:
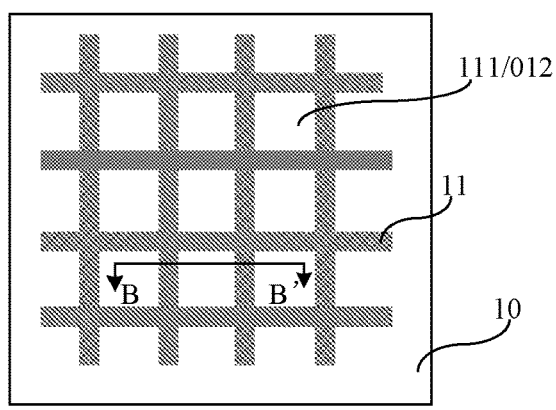
FIG. 4 is a schematic top view of an array substrate provided by an embodiment of the present disclosure.
Figure 5A:
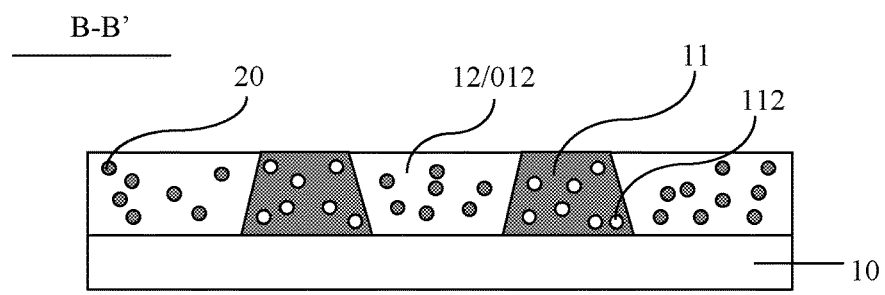
FIG. 5A is a schematic cross-sectional view of the array substrate in FIG. 4 along a direction B-B'.

FIG. 4 is a schematic top view of an array substrate provided by an embodiment of the present disclosure, and FIG. 5A is a schematic cross-sectional view of the array substrate in FIG. 4 along a direction B-B'. As shown in FIGS. 4 and 5A, an embodiment of the present disclosure provides an array substrate, including: a substrate 10 and a pixel defining layer 11 disposed on the substrate 10, the pixel defining layer 11 includes a plurality of opening areas 111, and one quantum dot light emitting device 012 is disposed corresponding to each opening area 111. The quantum dot light emitting device 012 includes a quantum dot light emitting layer 12, a material of the quantum dot light emitting layer 12 is a quantum dot material, a material of the pixel defining layer 11 includes a magnetic particle 112, and a thickness of the pixel defining layer 11 ranges from 20 nm to 50 nm.

As shown in FIG. 4, the array substrate includes a plurality of quantum dot light emitting devices 012, and the plurality of quantum dot light emitting devices 012 are in one-to-one correspondence with the plurality of opening areas 111, that is, the plurality of opening areas 111 are also in one-to-one correspondence with the plurality of sub-pixels P as mentioned above.

Figure 3:
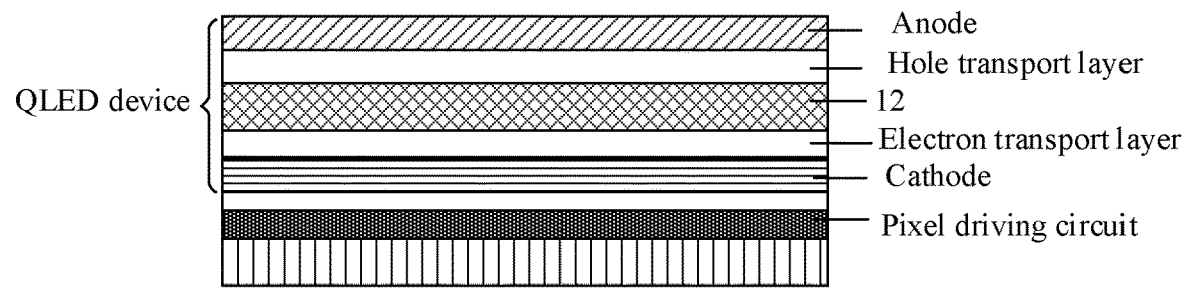
FIG. 3 is a schematic diagram of a structure of a sub-pixel in another display panel provided by an embodiment of the present disclosure.

FIG. 3 is a schematic diagram of a structure of a sub-pixel in another display panel provided by an embodiment of the present disclosure. As shown in FIGS. 2 and 3, the quantum dot light emitting device also includes a cathode and an anode located on both sides of the quantum dot light emitting layer 12, a hole transport layer between the quantum dot light emitting layer 12 and the anode, and an electron transport layer between the quantum dot light emitting layer 12 and the cathode. Of course, according to needs, in some embodiments, a hole injection layer may be provided between the hole transport layer and the anode, and an electron injection layer may be provided between the electron transport layer and the cathode.

The above-mentioned quantum dot light emitting device may be a normal quantum dot light emitting device or an inverted quantum dot light emitting device.

For example, as shown in FIG. 2, in the case where the above-mentioned quantum dot light emitting device is a normal quantum dot light emitting device, the driving TFT may be connected to an anode of the normal quantum dot light emitting device. It should be noted that FIG. 2 is only a schematic diagram, and does not show the connection relationship between the pixel driving circuit and the normal quantum dot light emitting device (in practice, a suitable pixel driving circuit can be selected according to needs). For example, the driving TFT in the pixel driving circuit may be connected to the anode of the normal quantum dot light emitting device through a via hole located in an insulating layer between the driving TFT and the anode.

For example, as shown in FIG. 3, in the case where the above-mentioned quantum dot light emitting device is an inverted quantum dot light emitting device, the driving TFT may be connected to a cathode of the inverted quantum dot light emitting device. It should be noted that although both the normal quantum dot light emitting device and the inverted quantum dot light emitting device are connected to the driving TFT, the driving circuits are different.

The material of the quantum dot light emitting layer 12 is a quantum dot material. In a case where electrons and holes enter the quantum dot light emitting layer 12 through the electron transport layer and the hole transport layer, respectively, the quantum dot material will be excited by exciton energy to emit light. In addition, due to a quantum confinement effect of quantum dots, a wavelength of light emitted by the recombination of the electrons and the holes will vary with the size of the quantum dot, and quantum dot materials of different sizes will emit light of different colors.

Because the size of the quantum dot determines the color of the light emitted by the quantum dot, the size of the quantum dot in the quantum dot light emitting layer 12 in the first color sub-pixel, the size of the quantum dot in the quantum dot light emitting layer 12 in the second color sub-pixel, and the size of the quantum dot in the quantum dot light emitting layer 12 in the third color sub-pixel are different from each other. In a case where the first color sub-pixel, the second color sub-pixel, and the third color sub-pixel are a red sub-pixel, a green sub-pixel, and a blue sub-pixel, respectively, the size of the quantum dot in the quantum dot light emitting layer 12 in the red sub-pixel is the largest, and the size of the quantum dot in the quantum dot light emitting layer 12 in the blue sub-pixel is the smallest. For example, the size of the quantum dot in the quantum dot light emitting layer 12 in the red sub-pixel may be 2.4 nm, the size of the quantum dot in the quantum dot light emitting layer 12 in the green sub-pixel may be 1.7 nm, and the size of the quantum dot in the quantum dot light emitting layer 12 in the blue sub-pixel may be 1.0 nm.

For example, the magnetic particle in the pixel defining layer 11 may include a ferromagnetic particle.

In a case where the thickness of the pixel defining layer is too small, a part area of the anode in the normal quantum dot light emitting device or the cathode in the inverted quantum dot light emitting device may not be covered by the pixel defining layer and may easily leak electricity, in addition, in the subsequent, a film layer such as a quantum dot light emitting layer may be formed in a place where light should not be emitted, which may cause a disordered pattern. Therefore, the thickness of the pixel defining layer 11 cannot be too small. Based on this, in terms of process technology, for example, a plasma enhanced chemical vapor deposition (PECVD) method can be used to manufacture the pixel defining layer 11. However, in a case where the pixel defining layer is formed through PECVD, the thickness of the pixel defining layer is relatively large, for example, greater than 50 nm, resulting in a large step difference. In this way, in a case where the quantum dot light emitting layer is subsequently formed by a spin coating process, the problem of uneven film formation may occur.

In the array substrate provided by the embodiment of the present disclosure, the material of the pixel defining layer 11 includes a magnetic particle 112. In this way, when manufacturing the pixel defining layer 11, by coating a solution including the magnetic particle 112 and applying a magnetic field to an area of the substrate 10 where the pixel defining layer 11 is to be formed, the magnetic particle 112 in the material of the pixel defining layer 11 can be uniformly deposited under the action of the magnetic field, and the thickness of the formed film can be controlled by controlling conditions such as solution concentration and coating speed, so that the pixel defining layer 11 having a thickness of 20 nm to 50 nm can be obtained. Compared with a method of, for example, obtaining the pixel defining layer having a thickness that is greater than 50 nm by PECVD in terms of technology process, the present disclosure can reduce the step difference of the formed pixel defining layer 11 and avoid the problem of uneven film formation during the subsequent process of forming the quantum dot light emitting layer 12.

Figure 5B:
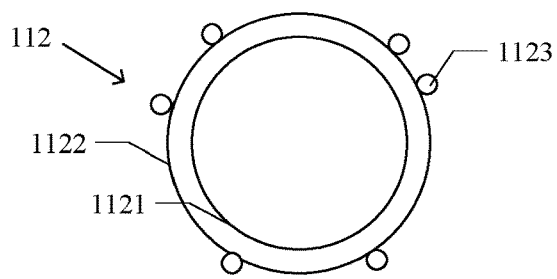
FIG. 5B is a schematic cross-sectional view of magnetic particles in a pixel defining layer.

FIG. 5B is a schematic cross-sectional view of magnetic particles in a pixel defining layer. For example, as shown in FIG. 5B, the magnetic particle 112 includes a first magnetic nanoparticle 1121 and an insulating layer 1122 that wraps the first magnetic nanoparticle.

For example, a surface of the insulating layer 1122 may have a first cross-linking group 1123.

For example, the first cross-linking group 1123 includes at least one selected from the group consisting of an allyl group, a sulfhydryl group, an olefin, a diene, and an epoxy.

For example, the quantum dot or the magnetic nanoparticle having the allyl group, the olefin, the diene, and the epoxy can be cured and cross-linked by irradiating or heating, and the quantum dot or the magnetic nanoparticle having the sulfhydryl group can be cured and cross-linked by irradiating.

For example, the first magnetic nanoparticle may include a ferromagnetic nanoparticle, such as ferroferric oxide ($Fe_3O_4$), iron oxide ($Fe_2O_3$), and the like.

For example, the insulating layer 1122 may be an inorganic insulating layer. The embodiments of the present disclosure are not limited thereto, and the insulating layer may be an organic insulating layer.

For example, the material of the inorganic insulating layer may include silicon oxide (SiO), silicon dioxide ($SiO_2$), and the like.

In a case where there are cross-linking groups on the surface of the magnetic particle, the magnetic particles can be cured and cross-linked by heating or irradiating. Thus, the magnetic particles are tightly combined, thereby avoiding the inside of the pixel defining layer from being separated.

For example, the quantum dot material has magnetism.

Figure 5C:
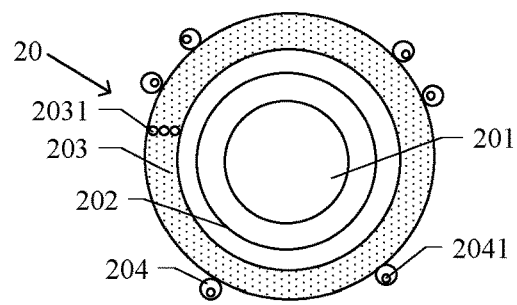
FIG. 5C is a schematic cross-sectional view of quantum dots in a quantum dot material.

For example, FIG. 5C is a schematic cross-sectional view of quantum dots in a quantum dot material. As shown in FIG. 5C, the quantum dot 20 in the quantum dot material includes a quantum dot core 201, a quantum dot shell 202 that wraps the quantum dot core 201, a magnetic nano layer 203, and a ligand 204. The quantum dot shell 202 is wrapped by the magnetic nano layer 203, the ligand 204 is located on an outer surface of the magnetic nano layer 203, and the ligand 204 comprises a second cross-linking group 2401.

For example, as shown in FIG. 5C, the magnetic nano layer 203 includes a second magnetic nanoparticle 2031, and a thickness of the magnetic nano layer 203 is 1 to 3 times of a particle diameter of the second magnetic nanoparticle 2031. That is, the magnetic nano layer 203 may include 1 to 3 layers of second magnetic nanoparticles 2031.

For example, a material of the quantum dot core may be indium phosphide (InP), a material of the quantum dot shell may be zinc sulfide (ZnS), and the second magnetic nanoparticle in the magnetic nano layer may include a ferromagnetic nanoparticle, for example, ferroferric oxide ($Fe_3O_4$), iron oxide ($Fe_2O_3$), and the like. The zinc sulfide in the quantum dot shell can be oxidized under a heating condition, for example, sulfur atoms are oxidized into gas that is discharged, oxygen atoms are filled to obtain zinc oxide (ZnO), the ZnO is an ionic compound, and can undergo ion exchange in the presence of iron ions, thereby obtaining a quantum dot having the InP/ZnS@$Fe_3O_4$ structure.

In terms of technology process, the quantum dots can be cured and cross-linked by heating or irradiating the quantum dots. In this way, the quantum dots are tightly combined, thereby avoiding the inside of the quantum dot light emitting layer 12 from being separated.

For example, the second cross-linking group includes at least one selected from the group consisting of an allyl group, a sulfhydryl group, an olefin, a diene, and an epoxy.

For example, the quantum dot or the magnetic nanoparticle having the allyl group, the olefin, the diene, and the epoxy can be cured and cross-linked by irradiating or heating, and the quantum dot or the magnetic nanoparticle having the sulfhydryl group can be cured and cross-linked by irradiating.

Figure 5D:
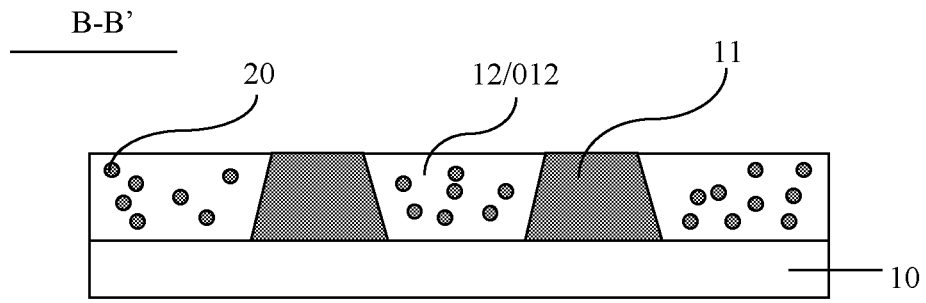
FIG. 5D is another schematic cross-sectional view of the array substrate in FIG. 4 along a direction B-B'.

FIG. 5D is another schematic cross-sectional view of the array substrate in FIG. 4 along a direction B-B'. As shown in FIGS. 4 and 5D, an embodiment of the present disclosure provides another array substrate, including a substrate 10 and a pixel defining layer 11 disposed on the substrate 10. The pixel defining layer 11 includes a plurality of opening areas 111, and each opening area 111 is provided with one quantum dot light emitting device 012 corresponding thereto. The quantum dot light emitting device 012 includes a quantum dot light emitting layer 12, a material of the quantum dot light emitting layer 12 is a quantum dot material, and the quantum dot material is magnetic.

For example, as shown in FIG. 5D, the material of the pixel defining layer 11 may be a material without magnetism, such as a resin material.

For example, the magnetic nanoparticle may be ferroferric oxide ($Fe_3O_4$) or iron oxide ($Fe_2O_3$), and the material of the inorganic insulating layer may be silicon oxide (SiO) or silicon dioxide ($SiO_2$).

In the array substrate provided by the embodiment of the present disclosure, the material of the quantum dot light emitting layer 12 is a magnetic quantum dot material, in this way, when manufacturing the quantum dot light emitting layer 12, a magnetic field can be applied to the area of the substrate 10 where the quantum dot light emitting layer is to be formed, so that the quantum dot material can be uniformly deposited under the action of the magnetic field, thereby obtaining a quantum dot light emitting layer 12 having a uniform formed film. Compared with a method of, for example, forming a quantum dot light emitting layer on the pixel defining layer with a step difference by a spin coating method in terms of technology process, the present disclosure can improve the uniformity of the formed film of the quantum dot light emitting layer 12 and simplify the production process.

For example, the structure of the quantum dot in the example shown in FIG. 5D may be the same as the structure of the quantum dot shown in FIG. 5C, for example, the quantum dot 20 includes a quantum dot core 201, a quantum dot shell 202 that wraps the quantum dot core 201, a magnetic nano layer 203, and a ligand 204. The quantum dot shell 202 is wrapped by the magnetic nano layer 203, the ligand 204 is located on an outer surface of the magnetic nano layer 203, and the ligand 204 comprises a second cross-linking group 2401.

For example, the magnetic nano layer 203 includes a magnetic nanoparticle 2031, and a thickness of the magnetic nano layer 203 is 1 to 3 times of a particle diameter of the magnetic nanoparticle 2031. That is, the magnetic nano layer 203 may include 1 to 3 layers of magnetic nanoparticles 2031.

For example, a material of the quantum dot core may be indium phosphide (InP), a material of the quantum dot shell may be zinc sulfide (ZnS), and the magnetic nanoparticle in the magnetic nano layer may be ferroferric oxide ($Fe_3O_4$) or iron oxide ($Fe_2O_3$). The zinc sulfide in the quantum dot shell can be oxidized under a heating condition, for example, sulfur atoms are oxidized into gas that is discharged, oxygen atoms are filled to obtain zinc oxide (ZnO), the ZnO is an ionic compound, and can undergo ion exchange in the presence of iron ions, thereby obtaining a quantum dot having the InP/ZnS@$Fe_3O_4$ structure.

In terms of technology process, the quantum dots can be cured and cross-linked by heating or irradiating the quantum dots. In this way, the quantum dots are tightly combined, thereby avoiding the inside of the quantum dot light emitting layer 12 from being separated.

As shown in FIG. 4 and FIG. 5A, an embodiment of the present disclosure also provides a manufacturing method of an array substrate, including: forming a pixel defining layer 11 including a plurality of opening areas 111 and a plurality of quantum dot light-emitting devices, which are in one-to-one correspondence with the plurality of opening areas 111 and are located in the plurality of opening areas 111, on a substrate 10. The quantum dot light emitting device includes a quantum dot light emitting layer 12, and the material of the quantum dot light emitting layer 12 is a quantum dot material.

Figure 6:
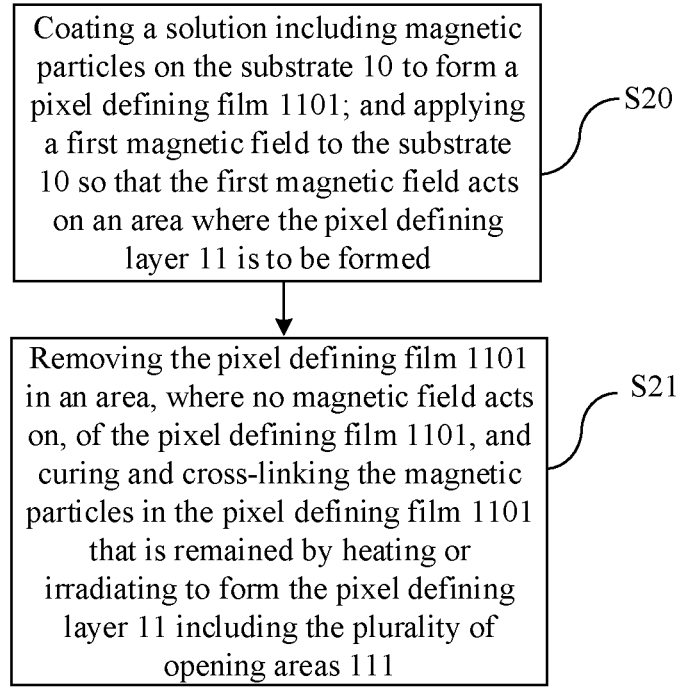
FIG. 6 is a flowchart of a manufacturing method of an array substrate provided by an embodiment of the present disclosure.
Figure 7:
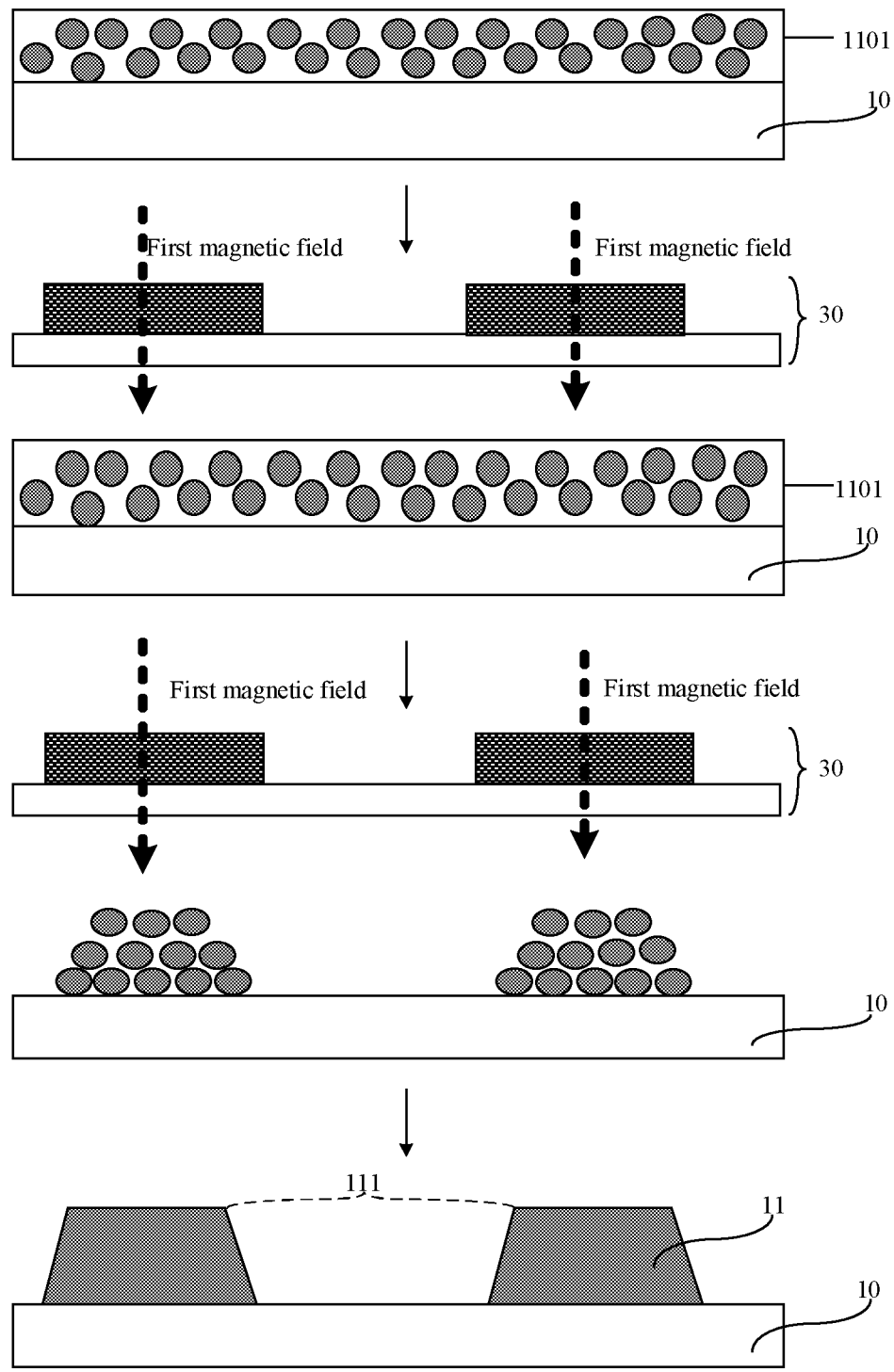
FIG. 7 is a schematic diagram of a manufacturing process of an array substrate provided by an embodiment of the present disclosure.

FIG. 6 is a flowchart of a manufacturing method of an array substrate provided by an embodiment of the present disclosure, and FIG. 7 is a schematic diagram of a manufacturing process of an array substrate provided by an embodiment of the present disclosure. As shown in FIGS. 6 and 7, forming the pixel defining layer 11 including the plurality of opening areas 111 on the substrate 10 includes the following steps:

S20, coating a solution including magnetic particles on the substrate 10 to form a pixel defining film 1101; and applying a first magnetic field to the substrate 10 so that the first magnetic field acts on an area where the pixel defining layer 11 is to be formed.

S21, removing the pixel defining film 1101 in an area, where no magnetic field acts on, of the pixel defining film 1101, and curing and cross-linking the magnetic particles in the pixel defining film 1101 that is remained by heating or irradiating to form the pixel defining layer 11 including the plurality of opening areas 111.

For example, the magnetic particle includes a magnetic nanoparticle and an insulating layer that wraps the magnetic nanoparticle, and the surface of the magnetic particle has a cross-linking group, that is, the surface of the insulating layer has the cross-linking group.

For example, the magnetic nanoparticle includes a ferromagnetic nanoparticle, such as ferroferric oxide ($Fe_3O_4$), iron oxide ($Fe_2O_3$), and the like. For example, the insulating layer that wraps the magnetic nanoparticle may be an inorganic insulating layer, for example, the material of the inorganic insulating layer may include silicon oxide (SiO), silicon dioxide ($SiO_2$), and the like. For example, the first cross-linking group may include at least one selected from the group consisting of an allyl group, a sulfhydryl group, an olefin, a diene, and an epoxy.

The surface of the magnetic particle has a cross-linking group, and the magnetic particle can be cured and cross-linked by heating or irradiating. For example, the magnetic particles are heated to 80° C.~200° C. to be cured and cross-linked, or the magnetic particles are cured and cross-linked under irradiation of ultraviolet light. In this way, the magnetic particles are tightly combined, thereby avoiding the inside of the pixel defining layer 11 from being separated.

Under the action of a magnetic field, the magnetic particles can be uniformly deposited in the area where the pixel defining layer 11 is to be formed, and a pixel defining layer 11, for example, having a thickness that is less than 50 nm can be obtained, thereby reducing the step difference at an opening position where the pixel defining layer 11 is formed, and avoiding the problem of uneven film formation when the quantum dot light emitting layer 12 is formed on the pixel defining layer 11 in the subsequent process.

It should be noted that those skilled in the art can control the thickness of the formed film by controlling conditions such as the concentration of the solution and the coating speed.

In the manufacturing method of the array substrate provided by the embodiment of the present disclosure, the material of the pixel defining layer 11 includes a magnetic particle, a first magnetic field is applied to the substrate 10 so that magnetic particles are uniformly deposited under the action of the first magnetic field, and therefore, a pixel defining layer 11 having a thickness that is less than 50 nm can be obtained, for example. Compared with the pixel defining layer having a thickness that is greater than 50 nm obtained by a method of PECVD, the present disclosure can reduce the step difference at the opening position where the pixel defining layer 11 is formed and avoid the problem of uneven film formation when the quantum dot light emitting layer 12 is formed on the pixel defining layer 11 in the subsequent process.

For example, the method of removing the pixel defining film 1101 in an area, where no magnetic field acts on, of the pixel defining film 1101, includes: coating a first solution on the pixel defining film 1101; washing the magnetic particles in the pixel defining film 1101 in the area, where no magnetic field acts on, of the pixel defining film 1101; and removing the pixel defining film 1101 in the area, where no magnetic field acts on, of the pixel defining film 1101. For example, a thickness of the pixel defining film 1101 ranges from 20 nm to 50 nm. Correspondingly, a thickness of the pixel defining layer 11 ranges from 20 nm to 50 nm.

It should be noted that, according to the magnetic particles in the pixel defining film 1101, the corresponding first solution may be selected to wash the magnetic particles, so as to remove the pixel defining film 1101 in the area, where no magnetic field acts on, of the pixel defining film 1101.

During this process, because the force applied to the magnetic particles in the pixel defining film 1101 in the area where the pixel defining layer 11 is to be formed by the first magnetic field is greater than the force applied to the magnetic particles when the magnetic particles are washed using the first solution, the magnetic particles in the area, where the magnetic field acts on, of the pixel defining film 1101 can be kept in a fixed position and will not be removed by washing through the first solution.

For example, the embodiment of the present disclosure may not limit the process used to form the quantum dot light emitting layer 12 for each quantum dot light emitting device on the substrate 10 on which the pixel defining layer 11 having a thickness of 20 nm-50 nm has been formed.

For example, the quantum dot light emitting layer 12 can be formed by an evaporation process on the substrate 10 on which the pixel defining layer 11 has been formed. Alternatively, the quantum dot light emitting layer 12 can be formed by a coating process on the substrate 10 on which the pixel defining layer 11 has been formed.

For example, as shown in FIG. 5A, the manufacturing method provided by the embodiment of the present disclosure may further include: coating a solution including a magnetic quantum dot material on the substrate 10 on which the pixel defining layer 11 has been formed to form a quantum dot light emitting film, and applying a magnetic field that acts on the area where the quantum dot light emitting layer 12 is to be formed to the substrate, removing the quantum dot light emitting film in the area, where no magnetic field acts on, of the quantum dot light emitting film, and curing and cross-linking the quantum dot material in the quantum dot light emitting film that is remained by heating or irradiating to form the quantum dot light emitting layer 12.

For example, before forming the quantum dot light emitting layer 12, for a normal quantum dot light emitting device, an anode, a hole injection layer, and a hole transport layer have been sequentially formed on the substrate 10. For an inverted quantum dot light emitting device, a cathode, an electron injection layer, and an electron transport layer have been sequentially formed on the substrate 10.

For example, the quantum dot light emitting layers 12 located in the sub-pixels of different colors, respectively, are sequentially formed.

For the convenience of the following description, the quantum dot light emitting layer 12 in the first color sub-pixel is referred to as a first color quantum dot light emitting layer 121, the quantum dot light emitting layer 12 in the second color sub-pixel is referred to as a second color quantum dot light emitting layer 122, and the quantum dot light emitting layer 12 in the third color sub-pixel is referred to as a third color quantum dot light emitting layer 123. The first color quantum dot light emitting layer 121, the second color quantum dot light emitting layer 122, and the third color quantum dot light emitting layer 123 do not mean that the colors of the corresponding quantum dot light emitting layers are the first color, the second color, and the third color, respectively, but mean that based on the difference among the size of the quantum dot in the first color quantum dot light emitting layer 121, the size of the quantum dot in the second color quantum dot light emitting layer 122, and the size of the quantum dot in the third color quantum dot light emitting layer 123, the light emitted by the first color quantum dot light emitting layer 121, the light emitted by the second color quantum dot light emitting layer 122, and the light emitted by the third color quantum dot light emitting layer 123 are light of the first color, light of the second color, and light of the third color, respectively.

Figure 8:
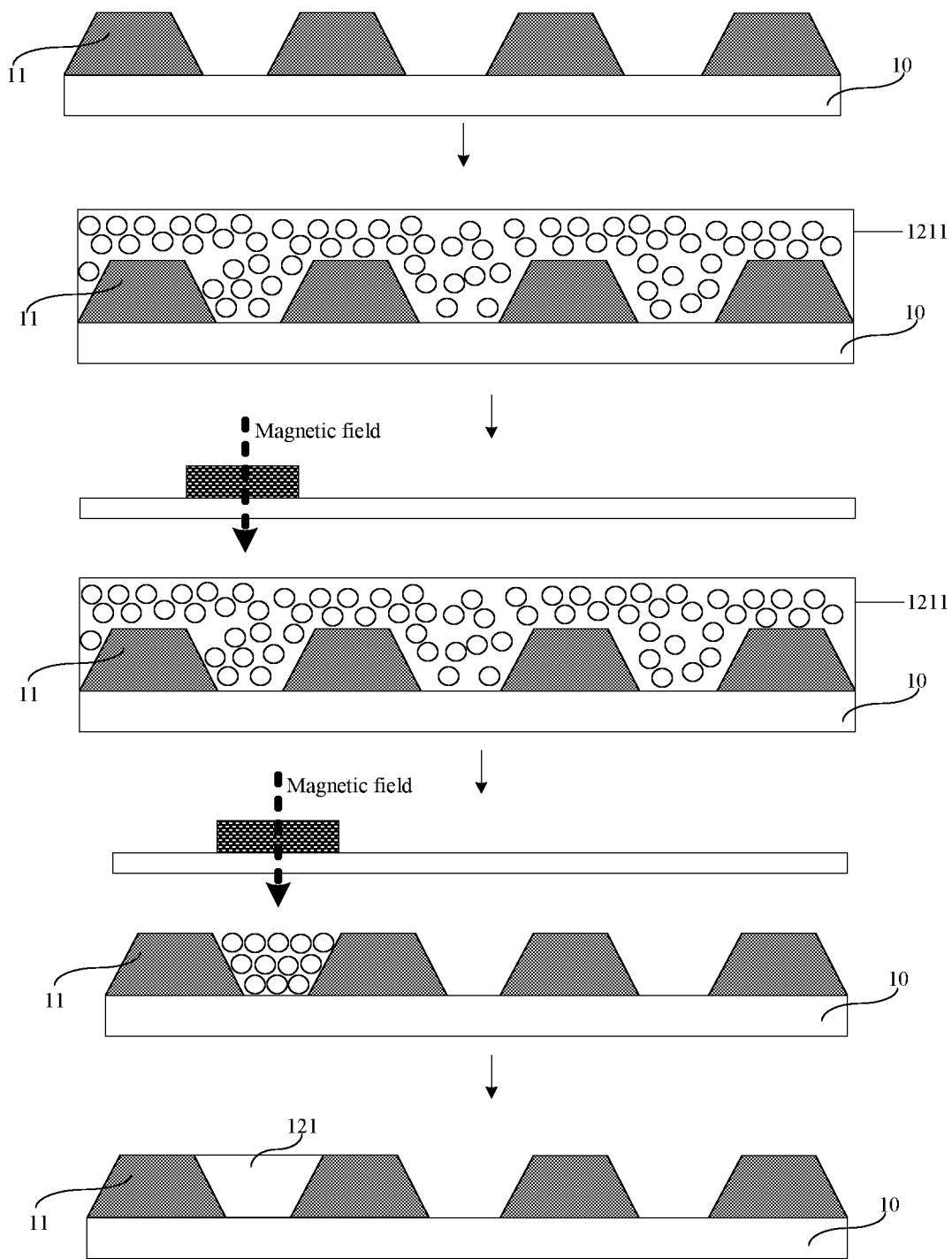
FIG. 8 is a schematic diagram of a manufacturing process of another array substrate provided by an embodiment of the present disclosure.

For example, FIG. 8 is a schematic diagram of a manufacturing process of another array substrate provided by an embodiment of the present disclosure. As shown in FIG. 8, a solution including a quantum dot material that has magnetism and emits light of the first color is coated on the substrate 10 on which the pixel defining layer 11 has been formed, so as to form the first color quantum dot light emitting film 1211, a magnetic field, which acts on the area, where the first color quantum dot light emitting layer 121 is to be formed, of the first color sub-pixel, is applied to the substrate 10, the first color quantum dot light emitting film 1211 in the area, where no magnetic field acts on, of the first color quantum dot light emitting film 1211 is removed, and the quantum dot material in the first color quantum dot light emitting film 1211 that is remained is cured and cross-linked by heating or irradiating to form the red quantum dot light emitting layer 121.

Figure 9:
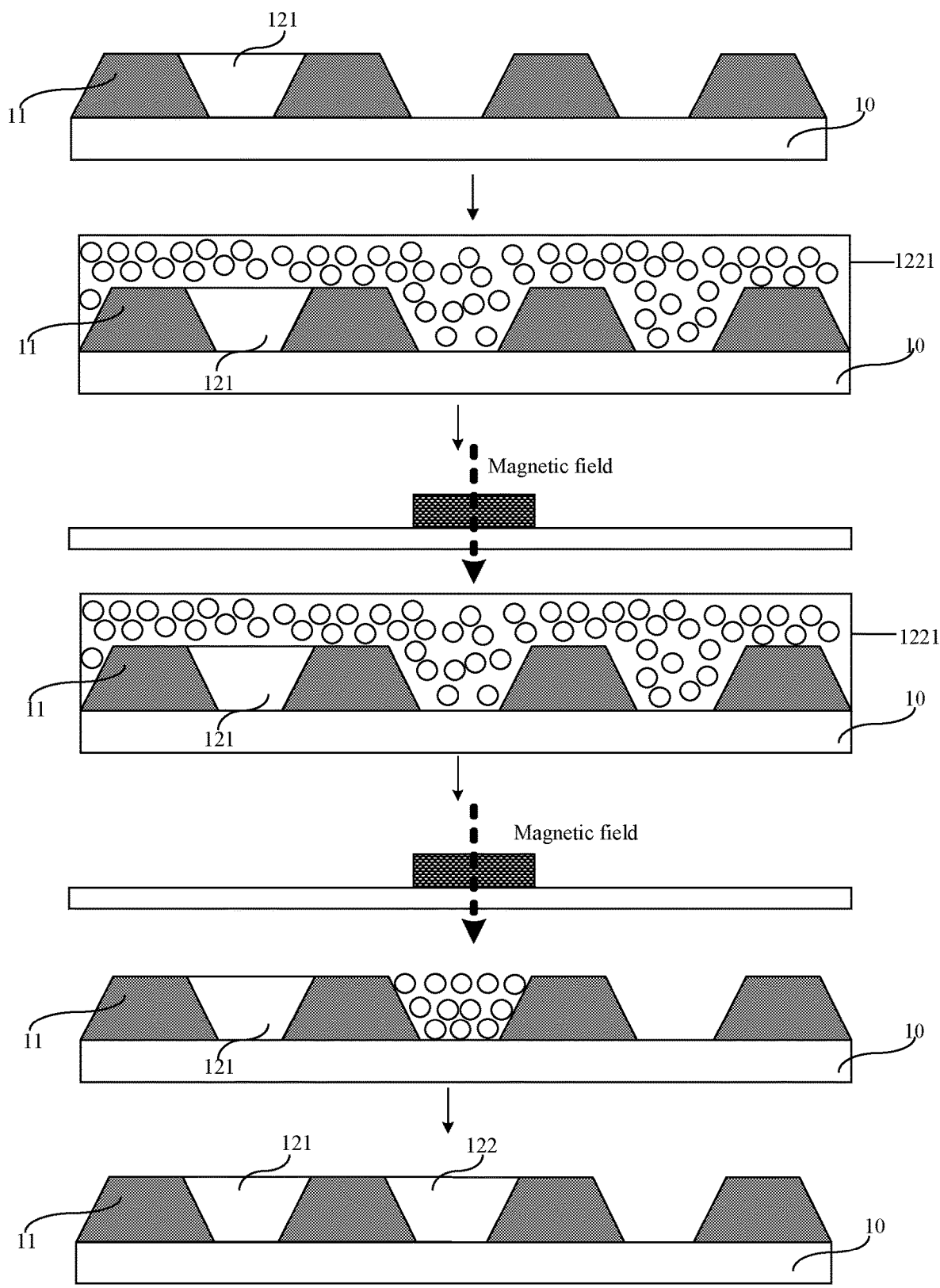
FIG. 9 is a schematic diagram of a manufacturing process of yet another array substrate provided by an embodiment of the present disclosure.

For example, FIG. 9 is a schematic diagram of a manufacturing process of yet another array substrate provided by an embodiment of the present disclosure. As shown in FIG. 9, a solution including a quantum dot material that has magnetism and emits light of the second color is coated on the substrate 10 on which the pixel defining layer 11 and the first color quantum dot light emitting layer 121 have been formed, so as to form the second color quantum dot light emitting film 1221, and a magnetic field, which acts on the area, where the second color quantum dot light emitting layer 121 is to be formed, of the second color sub-pixel, is applied to the substrate 10, the second color quantum dot light emitting film 1221 in the area, where no magnetic field acts on, of the second color quantum dot light emitting film 1221 is removed, and the quantum dot material in the second color quantum dot light emitting film 1221 that is remained is cured and cross-linked by heating or irradiating to form the second color quantum dot light emitting layer 122.

Figure 10:
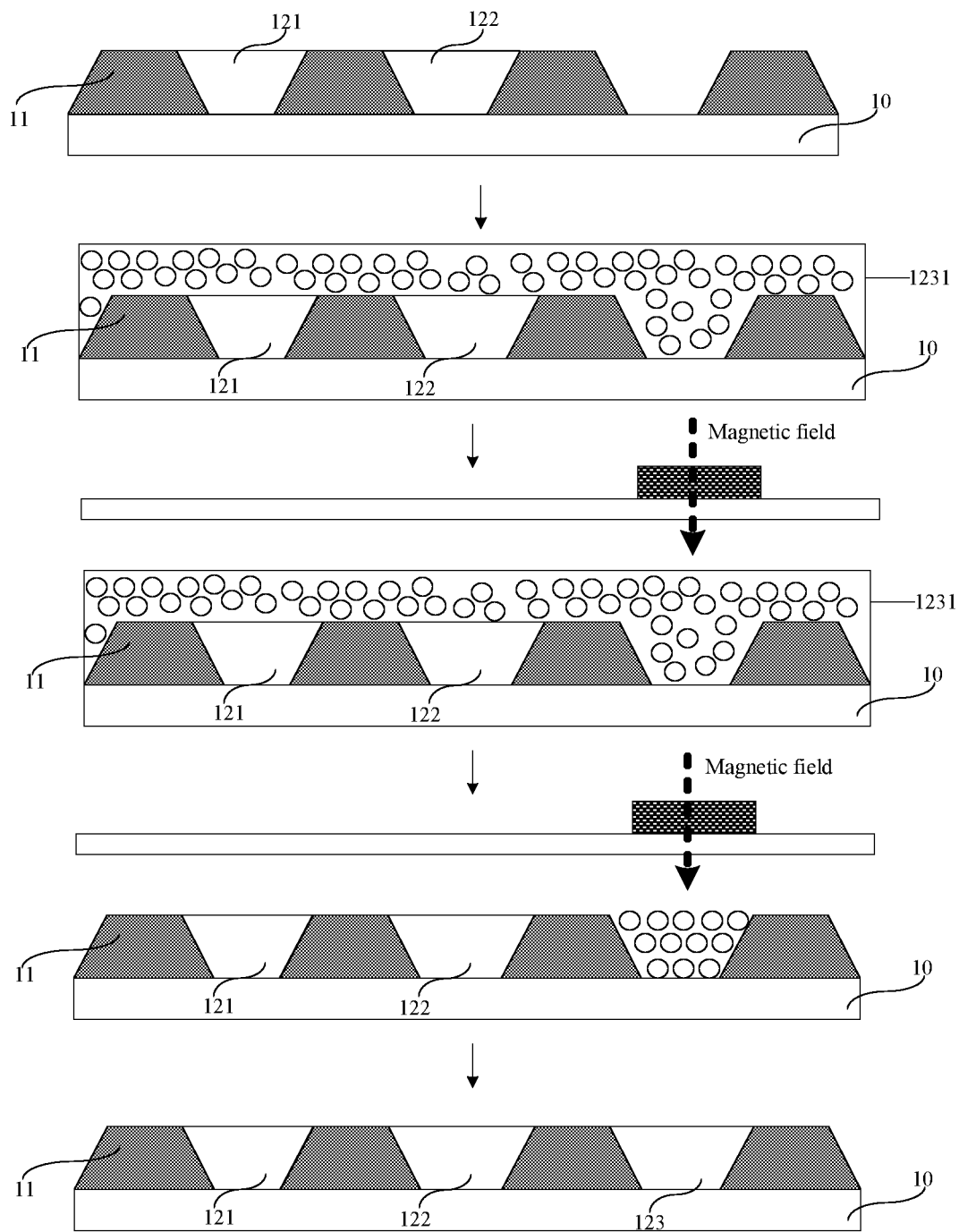
FIG. 10 is a schematic diagram of a manufacturing process of still another array substrate provided by an embodiment of the present disclosure.

For example, FIG. 10 is a schematic diagram of a manufacturing process of still another array substrate provided by an embodiment of the present disclosure. As shown in FIG. 10, a solution including a quantum dot material that has magnetism and emits light of the third color is coated on the substrate 10 on which the pixel defining layer 11, the first color quantum dot light emitting layer 121, and the second color quantum dot light emitting layer 122 have been formed, so as to form the third color quantum dot light emitting film 1231, and a magnetic field, which acts on the area, where the third color quantum dot light emitting layer 123 is to be formed, of the third color sub-pixel, is applied to the substrate 10, the third color quantum dot light emitting film 1231 in the area, where no magnetic field acts on, of the third color quantum dot light emitting film 1231 is removed, and the quantum dot material in the third color quantum dot light emitting film 1231 that is remained is cured and cross-linked by heating or irradiating to form the third color quantum dot light emitting layer 123.

Because the previously formed quantum dot light emitting layer has been cured and cross-linked, the structure of the formed quantum dot light emitting layer will not be affected in the subsequent process of forming the quantum dot light emitting layer of other colors.

Figure 11:
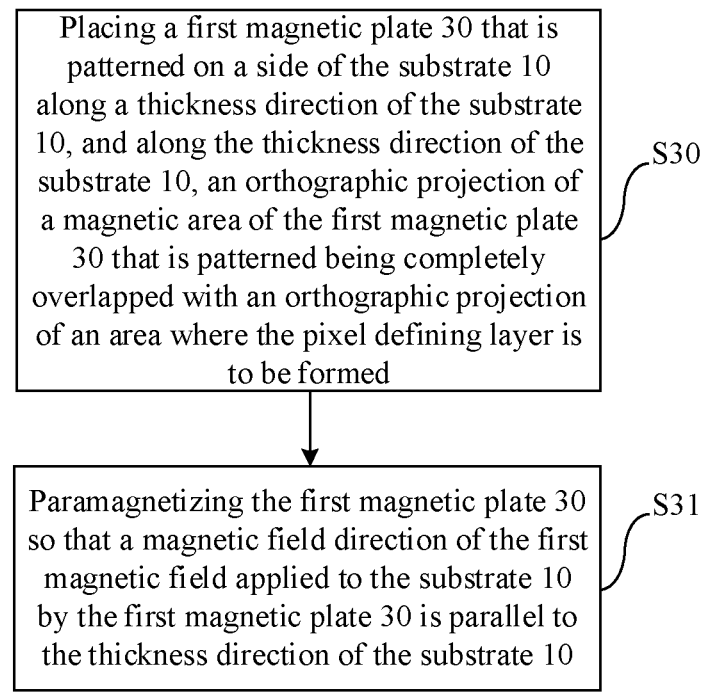
FIG. 11 is a flowchart of a manufacturing method of a magnetic plate provided by an embodiment of the present disclosure.

For example, FIG. 11 is a flowchart of a manufacturing method of a magnetic plate provided by an embodiment of the present disclosure. As shown in FIG. 11, the method of applying the first magnetic field to the substrate 10 includes the following steps.

S30, placing a first magnetic plate 30 that is patterned on a side of the substrate 10 along a thickness direction of the substrate 10, and along the thickness direction of the substrate 10, an orthographic projection of a magnetic area of the first magnetic plate 30 that is patterned being completely overlapped with an orthographic projection of an area where the pixel defining layer is to be formed.

S31, paramagnetizing the first magnetic plate 30 so that a magnetic field direction of the first magnetic field applied to the substrate 10 by the first magnetic plate 30 is parallel to the thickness direction of the substrate 10.

Figure 12:
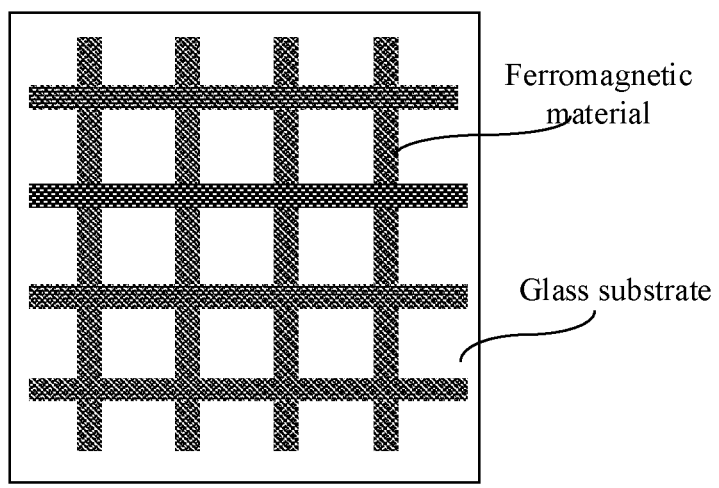
FIG. 12 is a schematic structural diagram of a magnetic plate provided by an embodiment of the present disclosure.

For example, FIG. 12 is a schematic structural diagram of a magnetic plate provided by an embodiment of the present disclosure. As shown in FIG. 12, the glass substrate can be patterned with ferromagnetic materials to form the first magnetic plate 30 that is patterned.

Referring to FIGS. 4 and 5D, an embodiment of the present disclosure provides another manufacturing method of an array substrate, including: forming a pixel defining layer 11 including a plurality of opening areas 111, and a plurality of quantum dot light emitting devices which are in one-to-one correspondence with the plurality of opening areas 111 and are located in the plurality of opening areas 111, on the substrate 10. The quantum dot light emitting device includes a quantum dot light emitting layer 12, a material of the quantum dot light emitting layer 12 is a quantum dot material, and the quantum dot material is magnetic. In the embodiment of the present disclosure, the pixel defining layer is formed after forming the quantum dot light emitting devices.

Figure 13:
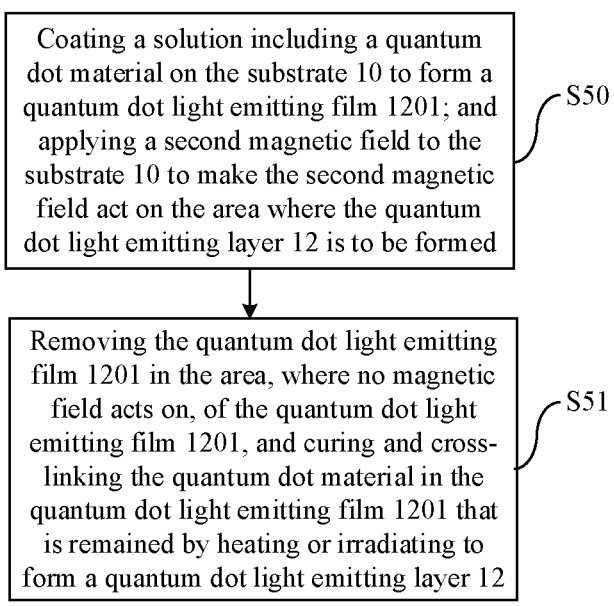
FIG. 13 is a flowchart of a manufacturing method of another array substrate provided by an embodiment of the present disclosure.
Figure 14:
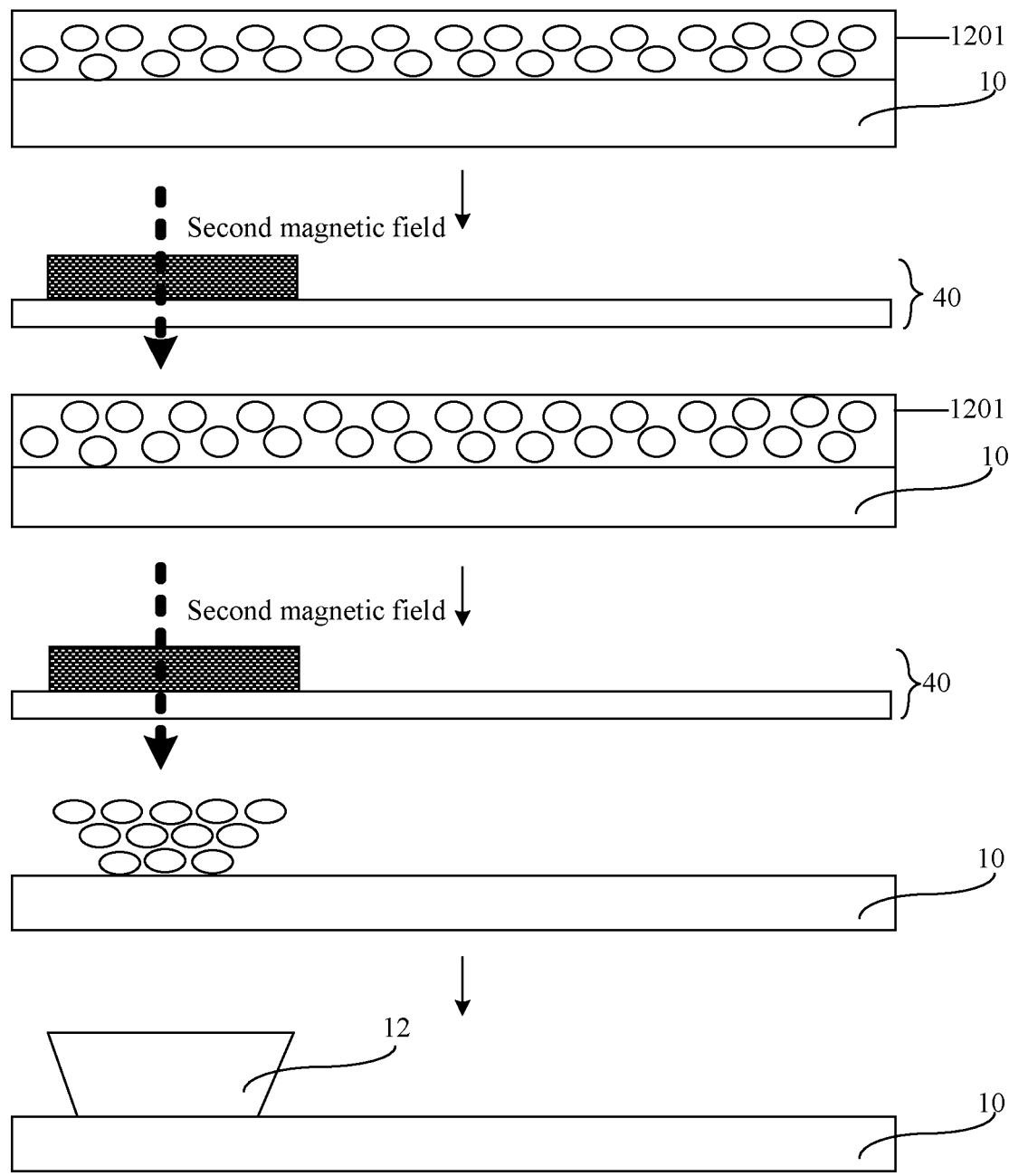
FIG. 14 is a schematic diagram of a manufacturing process of yet another array substrate provided by an embodiment of the present disclosure.

For example, FIG. 13 is a flowchart of a manufacturing method of another array substrate provided by an embodiment of the present disclosure; FIG. 14 is a schematic diagram of a manufacturing process of yet another array substrate provided by an embodiment of the present disclosure. As shown in FIG. 13, the method of forming the quantum dot light emitting layer 12 includes the following steps.

S50, coating a solution including a quantum dot material on the substrate 10 to form a quantum dot light emitting film 1201; and applying a second magnetic field to the substrate 10 to make the second magnetic field act on the area where the quantum dot light emitting layer 12 is to be formed.

S51, removing the quantum dot light emitting film 1201 in the area, where no magnetic field acts on, of the quantum dot light emitting film 1201, and curing and cross-linking the quantum dot material in the quantum dot light emitting film 1201 that is remained by heating or irradiating to form a quantum dot light emitting layer 12.

For example, before forming the quantum dot light emitting layer 12, for a normal quantum dot light emitting device, an anode, a hole injection layer, and a hole transport layer have been sequentially formed on the substrate 10. For an inverted quantum dot light emitting device, a cathode, an electron injection layer, and an electron transport layer have been sequentially formed on the substrate 10.

The quantum dot light emitting layers 12 in the sub-pixels of the same color are formed in the same step. Taking red sub-pixels, green sub-pixels, and blue sub-pixels as examples, the quantum dot light emitting layers 12 in a plurality of red sub-pixels are formed synchronously, the quantum dot light emitting layers 12 in a plurality of green sub-pixels are formed synchronously, and the quantum dot light emitting layers 12 in a plurality of blue sub-pixels are formed synchronously, but the quantum dot light emitting layers 12 in the sub-pixels of different colors are formed in stages.

For example, the quantum dot includes a quantum dot core, a quantum dot shell that wraps the quantum dot core, a magnetic nano layer, and a ligand. The quantum dot shell is wrapped by the magnetic nano layer, the ligand is located on an outer surface of the magnetic nano layer, and the ligand comprises a second cross-linking group.

For example, the magnetic nano layer includes a magnetic nanoparticle, and a thickness of the magnetic nano layer is 1 to 3 times of a particle diameter of the magnetic nanoparticle. That is, the magnetic nano layer may include 1 to 3 layers of magnetic nanoparticles 2031.

For example, a material of the quantum dot core may be indium phosphide (InP), a material of the quantum dot shell may be zinc sulfide (ZnS), and the magnetic nanoparticle in the magnetic nano layer may be ferroferric oxide ($Fe_3O_4$) or iron oxide ($Fe_2O_3$). The zinc sulfide in the quantum dot shell can be oxidized under a heating condition, for example, sulfur atoms are oxidized into gas that is discharged, oxygen atoms are filled to obtain zinc oxide (ZnO), the ZnO is an ionic compound, and can undergo ion exchange in the presence of iron ions, thereby obtaining a quantum dot having the InP/ZnS@$Fe_3O_4$ structure.

For example, the quantum dot in the quantum dot material has a cross-linking group, and the quantum dot in the quantum dot material can be cured and cross-linked by heating or irradiating. For example, the quantum dots in the quantum dot material are heated to 80° C.~200° C. to be cured and cross-linked, or the quantum dots in the quantum dot material are cured and cross-linked under irradiation of ultraviolet light. So that the quantum dots in the quantum dot material are tightly combined, thereby avoiding the inside of the quantum dot light emitting layer 12 from being separated.

For example, the cross-linking group includes at least one selected from the group consisting of an allyl group, a sulfhydryl group, an olefin, a diene, and an epoxy.

For example, the step of removing the quantum dot light emitting film 1201 in the area, where no magnetic field acts on, of the quantum dot light emitting film 1201 may include: coating a second solution on the quantum dot light emitting film 1201, washing the quantum dot material in the quantum dot light emitting film 1201 in the area, where no magnetic field acts on, of the quantum dot light emitting film 1201, and removing the quantum dot light emitting film 1201 in the area, where no magnetic field acts on, of the quantum dot light emitting film 1201.

According to the quantum dot material in the quantum dot light emitting film 1201, the corresponding second solution can be selected to wash the quantum dot material, so as to remove the quantum dot light emitting film 1201 in the area, where no magnetic field acts on, of the quantum dot light emitting film 1201.

During this process, because the force applied to the quantum dot material in the quantum dot light emitting film 1201 in the area where the quantum dot light emitting layer 12 is to be formed by the second magnetic field is greater than the force applied to the quantum dot material when the quantum dot material is washed using the second solution, the quantum dot material in the area, where the magnetic field acts on, of the quantum dot light emitting film 1201 can be kept in a fixed position and will not be removed by the second solution.

For example, the quantum dot light emitting layers 12 in the quantum dot light emitting devices located in the sub-pixels of different colors are formed sequentially.

Figure 16:
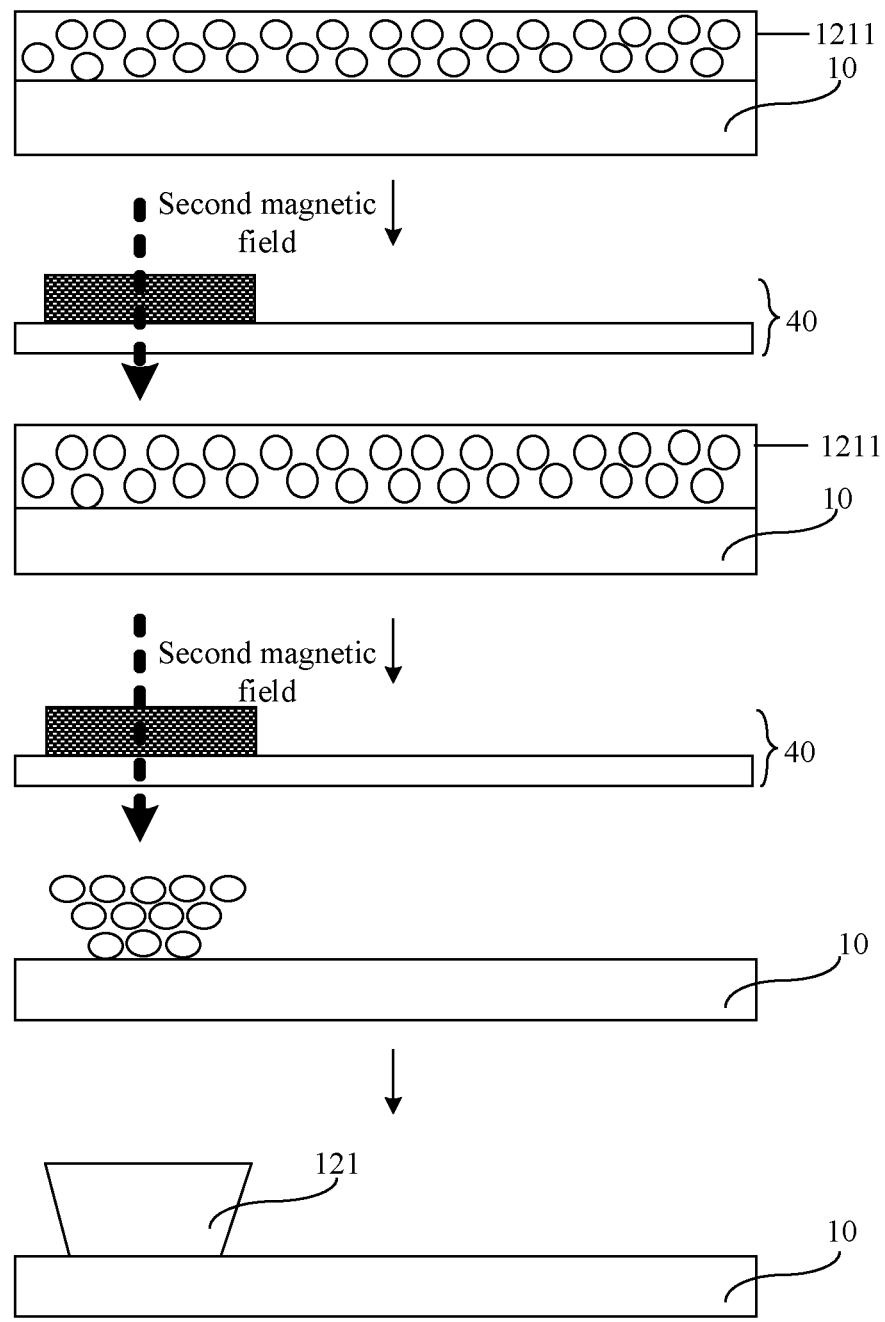
FIG. 16 is a schematic diagram of a manufacturing process of yet another array substrate provided by an embodiment of the present disclosure.
Figure 17:
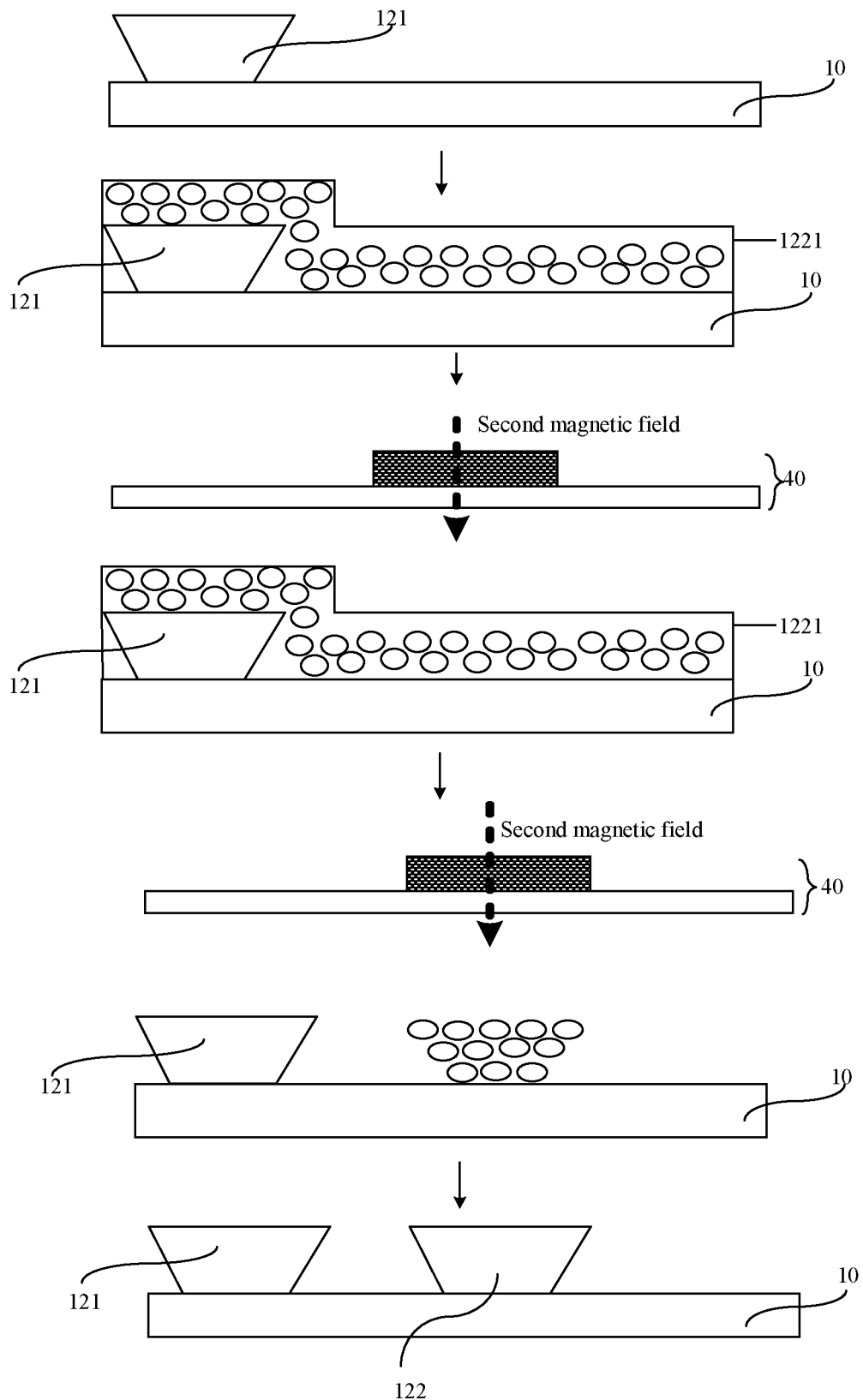
FIG. 17 is a schematic diagram of a manufacturing process of yet another array substrate provided by an embodiment of the present disclosure.
Figure 18:
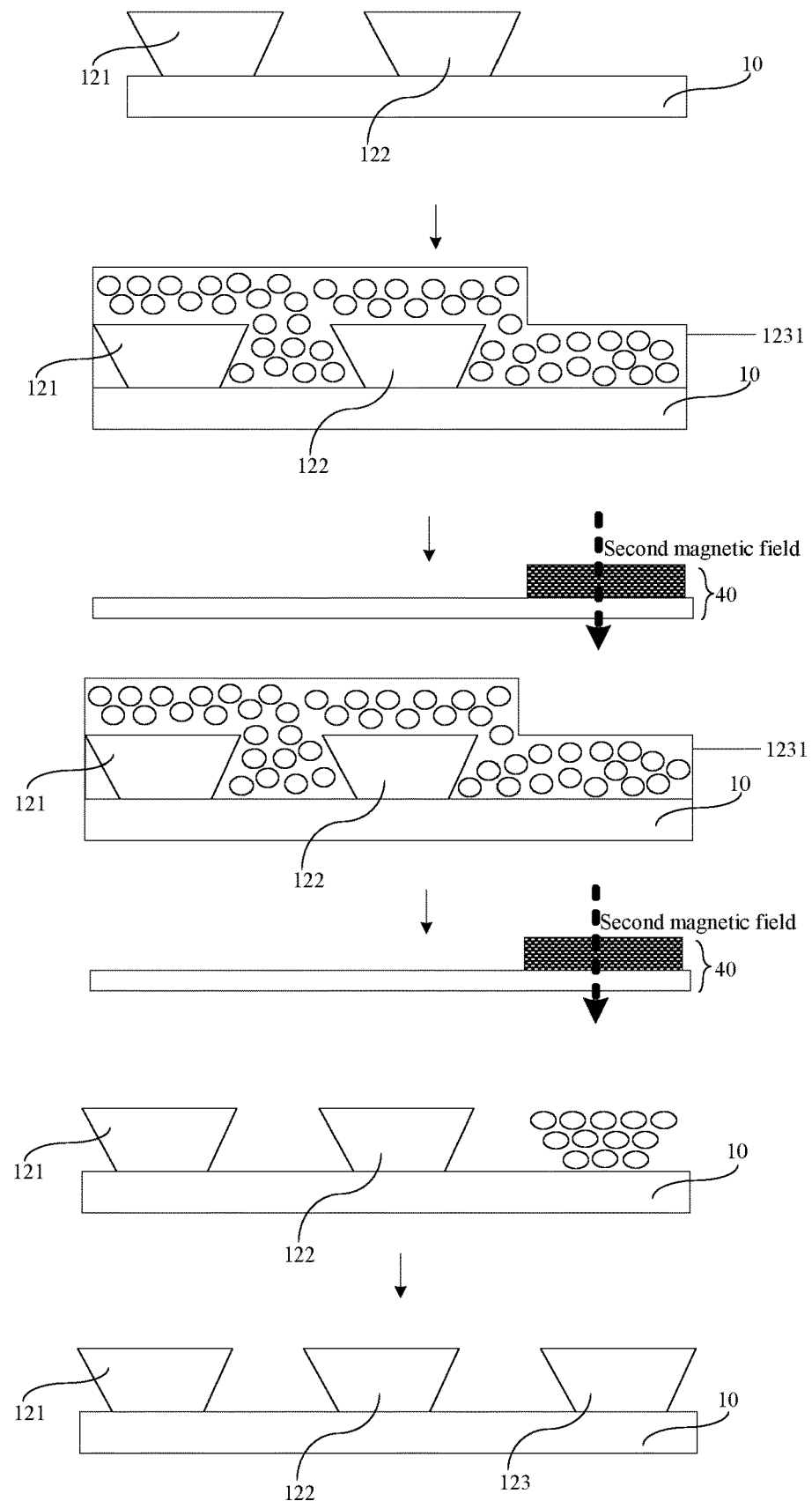
FIG. 18 is a schematic diagram of a manufacturing process of yet another array substrate provided by an embodiment of the present disclosure.

For example, a plurality of quantum dot light emitting devices include a quantum dot light emitting device that emits light of a first color, a quantum dot light emitting device that emits light of a second color, and a quantum dot light emitting device that emits light of a third color; the quantum dot light emitting device emitting light of the first color includes a first color quantum dot light emitting layer 121; the quantum dot light emitting device emitting light of the second color includes a second color quantum dot light emitting layer 122; and the quantum dot light emitting device emitting light of the third color includes a third color quantum dot light emitting layer 123. FIG. 15 is a flowchart of a manufacturing method of yet another array substrate provided by an embodiment of the present disclosure; FIG. 16 is a schematic diagram of a manufacturing process of yet another array substrate provided by an embodiment of the present disclosure; FIG. 17 is a schematic diagram of a manufacturing process of yet another array substrate provided by an embodiment of the present disclosure; and FIG. 18 is a schematic diagram of a manufacturing process of yet another array substrate provided by an embodiment of the present disclosure. As shown in FIGS. 15 to 18, the method of forming quantum dot light emitting layers in a plurality of quantum dot light emitting devices includes the following steps.

S501, coating a solution including a quantum dot material emitting light of the first color on the substrate 10 to form a first color quantum dot light emitting film 1211; applying the second magnetic field to the substrate 10 so that the second magnetic field acts on an area where the first color quantum dot light emitting layer 1211 is to be formed; removing the first color quantum dot light emitting film 1211 in an area, where no magnetic field acts on, of the first color quantum dot light emitting film 1211, and curing and cross-linking the quantum dot material in the first color quantum dot light emitting film 1211 that is remained by heating or irradiating to form the first color quantum dot light emitting layer 121.

S502, coating a solution including a quantum dot material emitting light of the second color on the substrate 10, on which the first color quantum dot light emitting layer 121 is formed, to form a second color quantum dot light emitting film 1221; making the second magnetic field act on an area where the second color quantum dot light emitting layer 122 is to be formed; removing the second color quantum dot light emitting film 1221 in an area, where no magnetic field acts on, of the second color quantum dot light emitting film 1221, and curing and cross-linking the quantum dot material in the second color quantum dot light emitting film 1221 that is remained by heating or irradiating to form the second color quantum dot light emitting layer 122.

S503, coating a solution including a quantum dot material emitting light of the third color on the substrate 10, on which the first color quantum dot light emitting layer 121 and the second color quantum dot light emitting layer 122 are formed, to form a third color quantum dot light emitting film 1231; making the second magnetic field act on an area where the third color quantum dot light emitting layer 123 is to be formed; removing the third color quantum dot light emitting film 1231 in an area, where no magnetic field acts on, of the third color quantum dot light emitting film 1231, and curing and cross-linking the quantum dot material in the third color quantum dot light emitting film 1231 that is remained by heating or irradiating to form the third color quantum dot light emitting layer 123.

The first color quantum dot light emitting layer 121, the second color quantum dot light emitting layer 122, and the third color quantum dot light emitting layer 123 do not mean that the colors of the corresponding quantum dot light emitting layers are the first color, the second color, and the third color, respectively, but mean that based on the difference among the size of the quantum dot in the first color quantum dot light emitting layer 121, the size of the quantum dot in the second color quantum dot light emitting layer 122, and the size of the quantum dot in the third color quantum dot light emitting layer 123, the light emitted by the first color quantum dot light emitting layer 121, the light emitted by the second color quantum dot light emitting layer 122, and the light emitted by the third color quantum dot light emitting layer 123 are the light of the first color, the light of the second color, and the light of the third color, respectively.

The above-mentioned first color, second color and third color are three primary colors.

Because the previously formed quantum dot light emitting layer has been cured and cross-linked, the structure of the formed quantum dot light emitting layer will not be affected in the subsequent process of forming the quantum dot light emitting layer of other colors.

Because the quantum dot light emitting layer 12 is formed on the substrate 10 first, when the quantum dot material is coated, the quantum dot material will not be affected by the thickness of the pixel defining layer 11, thereby avoiding the problem of uneven film formation of the quantum dot light emitting layer 12.

For example, the embodiment of the present disclosure does not limit the process used to form the pixel defining layer 11 on the substrate 10 on which the quantum dot light emitting layer 12 has been formed.

For example, the pixel defining layer 11 can be formed by an evaporation process on the substrate 10 on which the quantum dot light emitting layer 11 has been formed. Alternatively, the pixel defining layer 11 can be formed by a spin coating process on the substrate 10 on which the quantum dot light emitting layer 12 has been formed.

Figure 19:
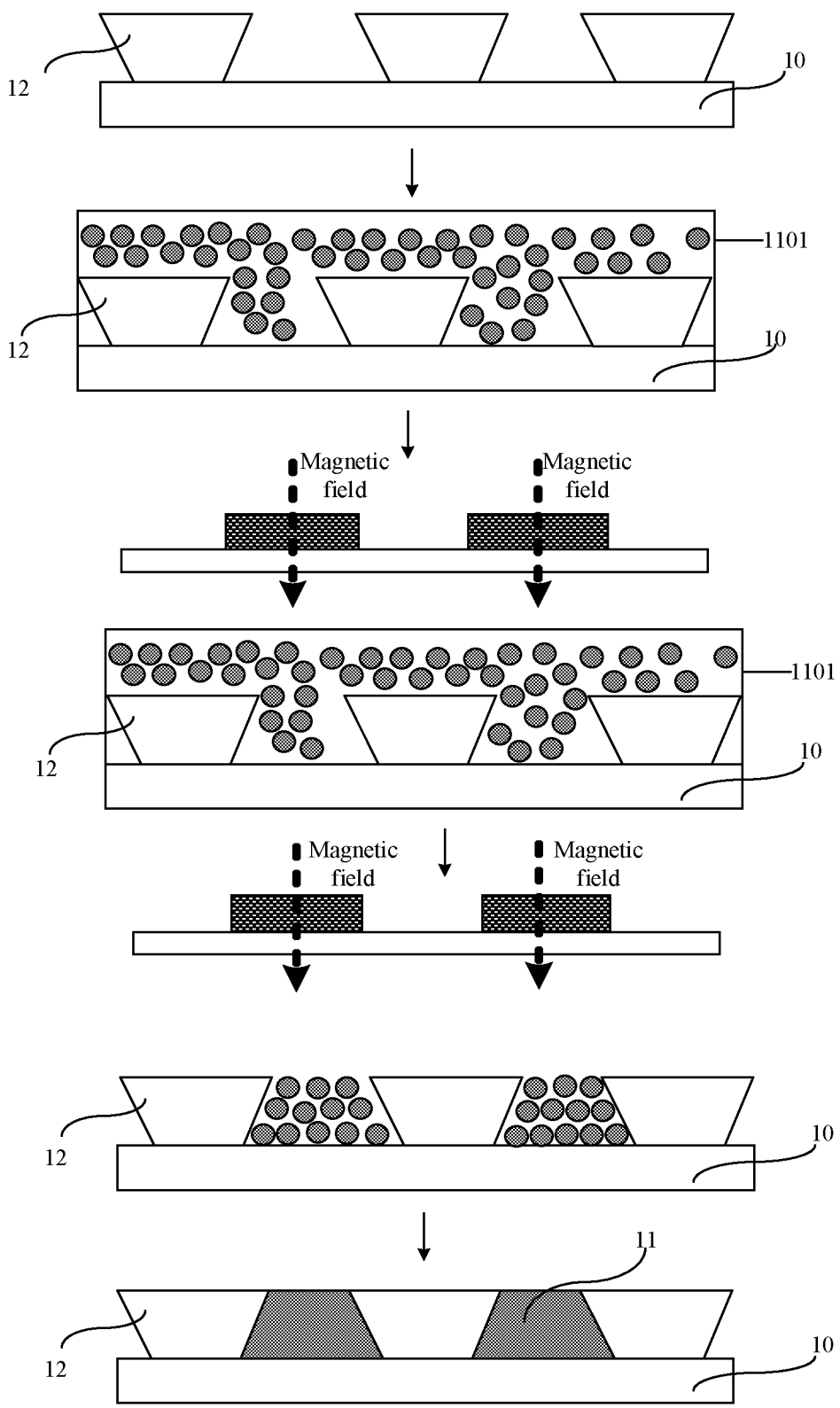
FIG. 19 is a schematic diagram of a manufacturing process of yet another array substrate provided by an embodiment of the present disclosure.

FIG. 19 is a schematic diagram of a manufacturing process of yet another array substrate provided by an embodiment of the present disclosure. As shown in FIG. 19, a solution including magnetic particles is coated on the substrate 10 on which the quantum dot light emitting layer 12 has been formed, so as to form a pixel defining layer 1101, a magnetic field is applied to the area, where the pixel defining layer 11 is to be formed, of the substrate 10, and the pixel defining film 1101 in the area, where no magnetic field acts on, of the pixel defining film 1101 is removed, and the magnetic particles in the pixel defining film 1101 that is remained are cured and cross-linked by heating or irradiating to form the pixel defining layer 11.

For example, for a normal quantum dot light emitting device, an evaporation process can be used to form an electron transport layer, an electron injection layer, and a cathode on a side of the formed quantum dot light emitting layer 12 and the formed pixel defining layer 11 away from the substrate 10, and the thickness of each of the electron transport layer, the electron injection layer, the cathode, and the pixel defining layer may be greater than 50 nm. For example, for an inverted quantum dot light emitting device, a spin coating process can be used to form a hole transport layer, a hole injection layer, and an anode on a side of the formed pixel defining layer 11 and the formed quantum dot light emitting layer 12 away from the substrate 10, the thickness of the pixel defining layer 11 may be 20 nm-50 nm, and the thickness of each of the hole transport layer, the hole injection layer, and the anode may not exceed 50 nm.

Figure 20:
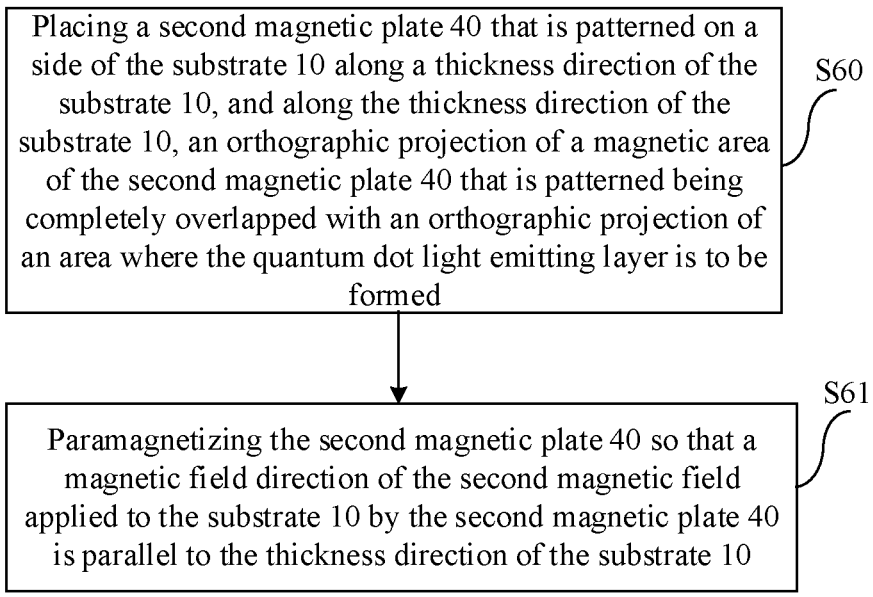
FIG. 20 is a flowchart of a manufacturing method of another magnetic plate provided by an embodiment of the present disclosure.

For example, FIG. 20 is a flowchart of a manufacturing method of another magnetic plate provided by an embodiment of the present disclosure. As shown in FIGS. 14, 16 to 18, and 20, the method of applying a second magnetic field to the substrate 10 includes the following steps.

S60, placing a second magnetic plate 40 that is patterned on a side of the substrate 10 along a thickness direction of the substrate 10, and along the thickness direction of the substrate 10, an orthographic projection of a magnetic area of the second magnetic plate 40 that is patterned being completely overlapped with an orthographic projection of an area where the quantum dot light emitting layer is to be formed.

S61, paramagnetizing the second magnetic plate 40 so that a magnetic field direction of the second magnetic field applied to the substrate 10 by the second magnetic plate 40 is parallel to the thickness direction of the substrate 10.

Figure 21:
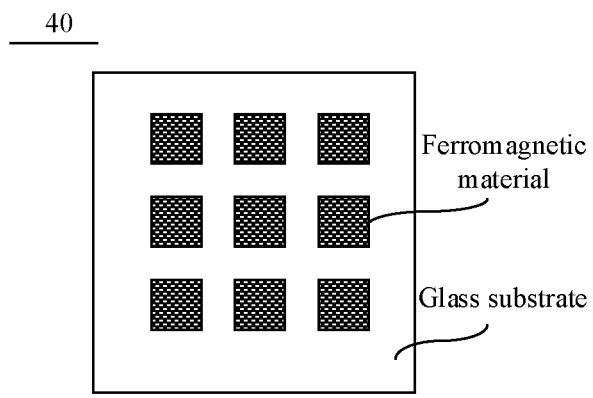
FIG. 21 is a schematic structural diagram of another magnetic plate provided by an embodiment of the present disclosure.

For example, FIG. 21 is a schematic structural diagram of another magnetic plate provided by an embodiment of the present disclosure. As shown in FIG. 21, the glass substrate can be patterned with ferromagnetic materials to form the second magnetic plate 40 that is patterned.

The following points need to be explained:

(1) In the drawings of the embodiments of the present disclosure, only the structures related to the embodiments of the present disclosure are involved, and other structures may refer to common designs.

(2) In case of no conflict, features in the same embodiment and different embodiments of the present disclosure may be combined with each other.

What are described above is related to the illustrative embodiments of the disclosure only and not limitative to the scope of the disclosure, the scopes of the disclosure are defined by the accompanying claims.

What is claimed is:

1. An array substrate, comprising: a substrate and a pixel defining layer disposed on the substrate, the pixel defining layer comprising a plurality of opening areas, and a plurality of quantum dot light emitting devices being arranged in one-to-one correspondence with the plurality of opening areas, wherein each of the plurality of quantum dot light emitting devices comprises a quantum dot light emitting layer, and a material of the quantum dot light emitting layer is a quantum dot material;

at least one selected from the group consisting of a material of the pixel defining layer and the quantum dot material is magnetic;

the pixel defining layer comprises a magnetic particle, and the magnetic particle comprises a first magnetic nanoparticle and an insulating layer that wraps the first magnetic nanoparticle.

2. The array substrate according to claim 1, wherein a thickness of the pixel defining layer ranges from 20 nm to 50 nm.

3. The array substrate according to claim 1, wherein the magnetic particle comprises a ferromagnetic particle.

4. The array substrate according to claim 1, wherein a surface of the insulating layer has a first cross-linking group.

5. The array substrate according to claim 4, wherein a quantum dot in the quantum dot material comprises a quantum dot core, a quantum dot shell that wraps the quantum dot core, a magnetic nano layer, and a ligand, the quantum dot shell is wrapped by the magnetic nano layer, the ligand is located on an outer surface of the magnetic nano layer, and the ligand comprises a second cross-linking group.

6. The array substrate according to claim 5, wherein the magnetic nano layer comprises a second magnetic nanoparticle, and a thickness of the magnetic nano layer is 1 to 3 times of a particle diameter of the second magnetic nanoparticle.

7. The array substrate according to claim 6, wherein the second magnetic nanoparticle comprises a ferromagnetic nanoparticle.

8. The array substrate according to claim 5, wherein the first cross-linking group and the second cross-linking group comprise at least one selected from the group consisting of an allyl group, a sulfhydryl group, an olefin, a diene, and an epoxy.

9. A display panel, comprising the array substrate of claim 1, the display panel further comprising an encapsulation layer disposed on a side of the plurality of quantum dot light emitting devices away from the substrate.

10. A manufacturing method of an array substrate, comprising:
forming a pixel defining layer comprising a plurality of opening areas on a substrate; and
forming a plurality of quantum dot light emitting devices in the plurality of opening areas of the pixel defining layer, the quantum dot light-emitting device comprising a quantum dot light emitting layer, a material of the quantum dot light emitting layer being a quantum dot material,
wherein forming the pixel defining layer on the substrate comprises:
coating a solution including magnetic particles on the substrate to form a pixel defining film;
applying a first magnetic field to the substrate so that the first magnetic field acts on an area where the pixel defining layer is to be formed; and
removing the pixel defining film in an area, where no magnetic field acts on, of the pixel defining film, and curing and cross-linking the magnetic particles in the pixel defining film that is remained by heating or irradiating to form the pixel defining layer including the plurality of opening areas.

11. The manufacturing method of the array substrate according to claim 10, wherein removing the pixel defining film in the area, where no magnetic field acts on, of the pixel defining film, comprises:
coating a first solution on the pixel defining film;
washing the magnetic particles in the pixel defining film in the area, where no magnetic field acts on, of the pixel defining film; and
removing the pixel defining film in the area, where no magnetic field acts on, of the pixel defining film, a thickness of the pixel defining film ranging from 20 nm to 50 nm.

12. The manufacturing method of the array substrate according to claim 10, wherein applying the first magnetic field to the substrate comprises:
placing a first magnetic plate that is patterned on a side of the substrate along a thickness direction of the substrate, wherein an orthographic projection of a magnetic area of the first magnetic plate that is patterned on the substrate completely overlaps with an orthographic projection of an area where the pixel defining layer is to be formed on the substrate; and
paramagnetizing the first magnetic plate so that a magnetic field direction of the first magnetic field applied to the substrate by the first magnetic plate is parallel to the thickness direction of the substrate.

13. A manufacturing method of an array substrate, comprising:
forming a plurality of quantum dot light emitting devices on a substrate, wherein each of the plurality of quantum dot light emitting devices comprises a quantum dot light emitting layer, a material of the quantum dot light emitting layer is a quantum dot material, and the quantum dot material is magnetic, and forming the quantum dot light emitting layer comprises:
coating a solution including the quantum dot material on the substrate to form a quantum dot light emitting film;
applying a second magnetic field to the substrate so that the second magnetic field acts on an area where the quantum dot light emitting layer is to be formed;
removing the quantum dot light emitting film in an area, where no magnetic field acts on, of the quantum dot light emitting film, and curing and cross-linking the quantum dot material in the quantum dot light emitting film that is remained by heating or irradiating to form the quantum dot light emitting layer;
after forming the plurality of quantum dot light emitting devices, the method further comprises:
forming a pixel defining layer including a plurality of opening areas on the substrate, wherein the plurality of quantum dot light emitting devices are in one-to-one correspondence with the plurality of opening areas and are located in the plurality of opening areas.

14. The manufacturing method of the array substrate according to claim 13, wherein removing the quantum dot light emitting film in the area, where no magnetic field acts on, of the quantum dot light emitting film comprises:
coating a second solution on the quantum dot light emitting film;
washing the quantum dot material in the quantum dot light emitting film in the area, where no magnetic field acts on, of the quantum dot light emitting film; and
removing the quantum dot light emitting film in the area, where no magnetic field acts on, of the quantum dot light emitting film.

15. The manufacturing method of the array substrate according to claim 13, wherein the plurality of quantum dot light emitting devices comprise a quantum dot light emitting device that emits light of a first color, a quantum dot light emitting device that emits light of a second color, and a quantum dot light emitting device that emits light of a third color;
the quantum dot light emitting device that emits light of the first color comprises a first color quantum dot light emitting layer; the quantum dot light emitting device that emits light of the second color comprises a second color quantum dot light emitting layer; the quantum dot light emitting device that emits light of the third color comprises a third color quantum dot light emitting layer;

forming quantum dot light emitting layers in the plurality of quantum dot light emitting devices comprises:

coating a solution including a quantum dot material emitting light of the first color on the substrate to form a first color quantum dot light emitting film; applying the second magnetic field to the substrate so that the second magnetic field acts on an area where the first color quantum dot light emitting layer is to be formed; removing the first color quantum dot light emitting film in an area, where no magnetic field acts on, of the first color quantum dot light emitting film, and curing and cross-linking the quantum dot material in the first color quantum dot light emitting film that is remained by heating or irradiating to form the first color quantum dot light emitting layer;

coating a solution including a quantum dot material emitting light of the second color on the substrate, on which the first color quantum dot light emitting layer is formed, to form a second color quantum dot light emitting film; making the second magnetic field act on an area where the second color quantum dot light emitting layer is to be formed; removing the second color quantum dot light emitting film in an area, where no magnetic field acts on, of the second color quantum dot light emitting film, and curing and cross-linking the quantum dot material in the second color quantum dot light emitting film that is remained by heating or irradiating to form the second color quantum dot light emitting layer; and coating a solution including a quantum dot material emitting light of the third color on the substrate, on which the first color quantum dot light emitting layer and the second color quantum dot light emitting layer are formed, to form a third color quantum dot light emitting film; making the second magnetic field act on an area where the third color quantum dot light emitting layer is to be formed; removing the third color quantum dot light emitting film in an area, where no magnetic field acts on, of the third color quantum dot light emitting film, and curing and cross-linking the quantum dot material in the third color quantum dot light emitting film that is remained by heating or irradiating to form the third color quantum dot light emitting layer.

16. The manufacturing method of the array substrate according to claim 13, wherein applying the second magnetic field to the substrate comprises:

placing a second magnetic plate that is patterned on a side of the substrate along a thickness direction of the substrate, wherein an orthographic projection of a magnetic area of the second magnetic plate that is patterned on the substrate completely overlaps with an orthographic projection of an area where the quantum dot light emitting layer is to be formed on the substrate; and paramagnetizing the second magnetic plate so that a magnetic field direction of the second magnetic field applied to the substrate by the second magnetic plate is parallel to the thickness direction of the substrate.

* * * * *